United States Patent
Schultz et al.

(10) Patent No.: US 9,768,785 B2
(45) Date of Patent: *Sep. 19, 2017

(54) METHODS AND APPARATUS FOR COUNTING PULSES REPRESENTING AN ANALOG SIGNAL

(71) Applicant: Massachusetts Institute of Technology, Cambridge, MA (US)

(72) Inventors: Kenneth I. Schultz, Lexington, MA (US); Brian Tyrrell, Brookline, NH (US); Michael W. Kelly, North Reading, MA (US); Curtis B. Colonero, Shrewsbury, MA (US); Lawrence M. Candell, Arlington, MA (US); Daniel Mooney, Dracut, MA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 43 days.

This patent is subject to a terminal disclaimer.

(21) Appl. No.: 14/850,067

(22) Filed: Sep. 10, 2015

(65) Prior Publication Data

US 2015/0381183 A1 Dec. 31, 2015

Related U.S. Application Data

(60) Continuation of application No. 14/073,338, filed on Nov. 6, 2013, now Pat. No. 9,159,446, which is a (Continued)

(51) Int. Cl.
*H03K 21/02* (2006.01)
*H03M 1/00* (2006.01)
(Continued)

(52) U.S. Cl.
CPC .......... *H03K 21/023* (2013.01); *G11C 19/00* (2013.01); *H03K 23/548* (2013.01);
(Continued)

(58) Field of Classification Search
CPC .... H04N 5/378; H04N 5/335; H04N 5/37455; H03K 21/023; H03K 23/548; H03K 23/50
(Continued)

(56) References Cited

U.S. PATENT DOCUMENTS 4,475,047 A 10/1984 Ebert, Jr.
4,502,328 A 3/1985 Wood et al.
(Continued)

OTHER PUBLICATIONS

"ADSP-21msp58/59," *Analog Devices: DPS Microcomputers*, pp. 1-40 (1995).
(Continued)

*Primary Examiner* — Que T Le
(74) *Attorney, Agent, or Firm* — Cooley LLP

(57) ABSTRACT

Digital focal plane arrays (DFPAs) with multiple counters per unit cell can be used to convert analog signals to digital data and to filter the digital data. Exemplary DFPAs include two-dimensional arrays of unit cells, where each unit cell is coupled to a corresponding photodetector in a photodetector array. Each unit cell converts photocurrent from its photodetector to a digital pulse train that is coupled to multiple counters in the unit cell. Each counter in each unit cell can be independently controlled to filter the pulse train by counting up or down and/or by transferring data as desired. For example, a unit cell may perform in-phase/quadrature filtering of homodyne- or heterodyne-detected photocurrent with two counters: a first counter toggled between increment
(Continued)

and decrement modes with an in-phase signal and a second counter toggled between increment and decrement modes with a quadrature signal.

20 Claims, 17 Drawing Sheets

Related U.S. Application Data division of application No. 13/228,367, filed on Sep. 8, 2011, now Pat. No. 8,605,853.

(60) Provisional application No. 61/503,918, filed on Jul. 1, 2011.

(51) Int. Cl.
  *H03M 1/12* (2006.01)
  *H03M 1/60* (2006.01)
  *H03K 23/54* (2006.01)
  *G11C 19/00* (2006.01)

(52) U.S. Cl.
  CPC ........... *H03M 1/001* (2013.01); *H03M 1/004* (2013.01); *H03M 1/123* (2013.01); *H03M 1/60* (2013.01)

(58) Field of Classification Search
  USPC .......................................... 250/214 R, 208.1
  See application file for complete search history.

(56) References Cited

U.S. PATENT DOCUMENTS

| | | | |
|---|---|---|---|
| 4,509,118 A | 4/1985 | Shenk | |
| 4,590,583 A | 5/1986 | Miller | |
| 4,709,224 A | 11/1987 | Fiori, Jr. | |
| 5,461,425 A | 10/1995 | Fowler | |
| 5,583,605 A | 12/1996 | Sakamoto | |
| 5,963,675 A | 10/1999 | Van Der Wal | |
| 6,400,824 B1 | 6/2002 | Mansoorian | |
| 6,416,017 B1 | 7/2002 | Becker | |
| 6,441,829 B1 | 8/2002 | Blalock et al. | |
| 6,498,576 B1 | 12/2002 | Tian | |
| 6,518,909 B1 | 2/2003 | Yang | |
| 6,693,575 B1 | 2/2004 | Yang | |
| 6,740,879 B1 | 5/2004 | Tenhet et al. | |
| 6,788,237 B1 | 9/2004 | Bidermann | |
| 6,788,240 B2 | 9/2004 | Reyneri | |
| 6,791,611 B2 | 9/2004 | Yang | |
| 6,809,666 B1 | 10/2004 | Ewedemi | |
| 6,831,684 B1 | 12/2004 | Ewedemi | |
| 6,922,210 B2 | 7/2005 | Yang | |
| 6,970,195 B1 | 11/2005 | Bidermann | |
| 6,975,355 B1 | 12/2005 | Yang | |
| 6,985,181 B2 | 1/2006 | Ewedemi | |
| 7,038,716 B2 | 5/2006 | Klein | |
| 7,061,998 B1 | 6/2006 | Rodgers et al. | |
| 7,095,355 B1 | 8/2006 | Graham | |
| 7,315,273 B2 | 1/2008 | Muramatsu | |
| 7,483,058 B1 | 1/2009 | Frank | |
| 7,495,964 B2 | 2/2009 | Taylor | |
| 7,557,334 B2 | 7/2009 | Lee | |
| 7,623,173 B2 | 11/2009 | Nitta | |
| 7,671,313 B2 | 3/2010 | Watanabe | |
| 8,179,296 B2 | 5/2012 | Kelly et al. | |
| 9,294,701 B2* | 3/2016 | Sonoda ................. | H04N 5/378 |
| 2004/0047030 A1 | 3/2004 | MacAulay | |
| 2005/0280728 A1 | 12/2005 | Ishikawa | |
| 2006/0097902 A1 | 5/2006 | Muramatsu et al. | |
| 2006/0194624 A1 | 8/2006 | Hsieh et al. | |
| 2006/0243885 A1 | 11/2006 | Watanabe | |
| 2007/0075888 A1 | 4/2007 | Kelly | |
| 2007/0300047 A1 | 12/2007 | Alfano et al. | |
| 2008/0015742 A1 | 1/2008 | Kulyk | |
| 2009/0237534 A1 | 9/2009 | Okumura | |
| 2010/0085458 A1 | 4/2010 | Horiguchi | |
| 2010/0226495 A1 | 9/2010 | Kelly | |
| 2012/0218792 A1 | 8/2012 | Ziegler et al. | |

OTHER PUBLICATIONS

A. Bermak, A CMOS Imager With PFM/PWM Based Analog To-Digital Converter, IEEE International Symposium on Circuits and Systems, Aug. 7, 2002 vol. 4, pp. IV-53-IV-56.

A. Dickinson, B. Ackland, E-S. Eid, D. Inglis and E.R. Fossum, A 256x256 CMOS active pixel image sensor with motion detection, 1995 IEEE International Solid State Circuits Conference, Digest of Technical Papers, pp. 226-227, San Francisco CA, Feb. 1995.

A. Kitchen, A. Bermak, A. Bouzerdoum, "A 64° —64 CMOS digital pixel array based on pulse width analogue to digital conversion, with on chip linearising circuit," Proceedings of SPIE, vol. 5274, 2004, p. 163-171.

A. Kitchen, A. Bermak, and A. Bouzerdoum, "PWM digital pixel sensor based on asynchronous self-resetting scheme," IEEE Electron Device Letters, vol. 25, No. 7, pp. 471013473, Jul. 2004.

A. Peizerat et al. "An analog counter architecture for pixel-level ADC," 2007 International Image Sensor Workshop, Jun. 7-10, 2007, pp. 200-203.

A. Peizerat, M. Arques, P. Villard, J-L. Martin, "Pixel-Level A/D Conversion: Comparison of Two Charge Packets Counting Techniques," 2007 International Image Sensor Workshop, pp. 200-203 (2007).

A. Peizerat, M. Arques, P. Villard, J-L. Martin, "Pixel-Level ADC by Small Charge Quantum Counting," Electronics, Circuits and Systems, ICECS '06, pp. 423-426 (Issued Dec. 10-13, 2006; current version Jul. 2, 2007).

A. Dickinson, S. Mendis, D. Inglis, K. Azadet, and E.R. Fossum, CMOS Digital Camera with Parallel Analog to Digital Conversion Architecture, in Program of 1995 IEEE Workshop on CCDs and Advanced Image Sensors, Dana Point, CA, Apr. 20-22, 1995.

ADSP-21000 Family Application Handbook vol. 1, Analog Devices, Inc., pp. 113-140 (1994).

*Amain Electronics Literature Data Base*, http://02f2c2d.netsolhost.com/info.html (Mar. 28, 2006).

Ando, et al., "Ultrafast Correlation Image Sensor: Concept, Deesign, and Applications", 1997 International Conference on Solid-State Sensors and Actuators, Chicago, Jun. 16-19, 1997.

Ando, et., "Correlation Image Sensor: Two-Dimensional Matched Detection of Amplitude-Modulated Light", IEEE Transactions on Electron Devicees, vol. 50, No. 10, Oct. 2003.

B. Mansoorian, H-Y. Yee, S. Huang, and E.R. Fossum, A 250 mW, 60 frames/s 1280x720 pixel 9b CMOS digital image sensor, in Proc. 1999 IEEE International Solid-State Circuits Conference, pp. 310-311, San Francisco CA Feb. 1999.

B. Tyrrell et al. "Time Delay Integration and In-Pixel Spatiotemporal Filtering Using a Nanoscale Digital CMOS Focal Plane Readout." IEEE Transactions on electron Devices, vol. 56, No. 11, Nov. 2009.

B. Tyrrell, R. Berger, C. Colonero, J. Costa, M. Kelly, E. Ringdahl, K. Schultz, J. Wey. "Design Approaches for Digitally Dominated Active Pixel Sensors: Leveraging Moore's Law Scaling in Focal Plane Readout Design." Proceedings of SPIE, vol. 6900, Feb. 1, 2008.

Bisogni, et al., "Performance of a 4096 Pixel Photon Counting Chip," *SPIE*, vol. 3445, pp. 298-304 (Jul. 1998).

Brown et al. "Digital-pixel Focal Plane Array Development" Quantum Sensing and nanophotonic Devices VII. Ed. Manijeh Razeghi, Rengarajan Sudharsana, & Gail J. Brown, San Francisco, California, SA:SPIE, 2010. 76082H-10.

Brown, D.; Daniel, B.; Horikiri, T.; King, P.; Nelson, D.; Small, M. "Advances in high-performance sensors for the military and commercial market." Proceedings of SPIE—The International Society for Optical Engineering, vol. 4369 (2001), pp. 419-426.

(56) References Cited

OTHER PUBLICATIONS

Cabanski, W.; Breiter, R.; Koch, R.; Gross, W.; Mauk, K.-H.; Rode, W.; Ziegler, J.; Schneider, H.; Walther, M.; Oelmaier, R. "Third generation focal plane array IR detection modules at AIM." Infrared Physics & Technology, v 43, n. 3-5, Jun. Oct. 2002, p. 2.
Culurciello, et al., "CMOS Image Sensors for Sensor Networks", Analog Integr Circ Sig Process (2006) 49:39-51.
D. Yang, B. Fowler, A. El Gamal, "128° —128 pixel CMOS area image sensor with multiplexed pixel level A/D conversion," Proceedings of the Custom Integrated Circuits Conference, 1996, pp. 303-306.
Dahlin, M.; O'Rourke, E. "Advanced focal plane array systems for nextgeneration scanning remote sensing instruments." Proceedings of the SPIE—The International Society for Optical Engineering, v 4820, 2003, p. 406-17.
F. Boussaid, A. Bermak, and A. Bouzerdoum, "A novel ultra-low power reset/read-out technique for megapixels current-mode CMOS imagers," 2003 33rd Conference on European Solid-State Device Research, Sep. 16-18, 2003, pp. 59-62.
F. Guellec et al, "A 25 µm pitch LWIR focal plane array with pixel-level 15-bit ADC providing high well capacity and targeting 2mK NETD," Infrared Technology and Applications XXXVI, Proc. of SPIE vol. 7660, 76603T (2010).
Fossum, E.R., "Smart Focal-Plane technology for MicroInstruments and MicroRovers" (extended abstract) in Proc. 1992 NASA/OAST Workshop on Microtechnologies and Applications to Space Systems, Pasadena, CA, May 1992.
Fowler, B., et al., "A CMOS Area Image Sensor With Pixel Level A/D Conversion," Information Systems Laboratory, Electrical Engineering Dept., Stanford University, Stanford, CA., Session No. TP 13.5, pp. 1-11 (Jun. 21, 2001).
Giacomini, J.D., "High-Performance ADCs Require Dynamic Testing," Application Note AD-02, National Semiconductor Corporation, pp. 1-14 (Aug. 1992).
International Search Report and Written Opinion mailed May 3, 2012, in PCT/US2011/050889.
J. Nakamura, B. Pain, T. Nomoto, T. Nakamura, and E.R. Fossum, On-focal plane signal processing for current mode active pixel image sensors, in Tech. Rep. of the IEICE (Institute of Electronics, Information and Communications Engineers), EDI97-49, pp. 13-18, (Oct. 1997) in Japanese.
John L. Vampola (Jan. 1993). "Chapter 5—Readout electronics for infrared sensors", in David L. Shumaker: The Infrared and Electro-Optical Systems Handbook, vol. 3—Electro-Optical Components. The International Society for Optical Engineering.
Kang, S.G., et al., "Infrared FocalPlane Array Readout Integrated Circuit With On-Chip 14 b A/D Converter," *Proceedings of SPIE* 5234:287-295 (2004).
Kleinfelder, S., et al., "A 10,000 Frame/s CMOS Digital Pixel Sensor," *IEEE J. of Solid-State Circuits* 36(12):2049-2059 (Dec. 2001).
Kleinfelder, S., et al., "A 10 kframe/s 0.18µm CMOS Digital Pixel Sensor with Pixel-Level Memory," ISSCC 2001, Session 6 pp. 88-89 and 435-436 (2001).
Kleinfelder, S., et al., "Focal Plane Array Readout Integrated Circuit With Per-Pixel Analog-to-Digital and Digital-to-Analog Conversion," *Proceedings of SPIE* 4028:139-147 (2000).
Kozlowski, L.J., et al., "Progress Toward High-Performance Infrared Imaging Systems-on-a-Chip," *Proceedings of SPIE* 4130:245-253 (2000).
L. McIlrath, "Low power, low noise, ultra-wide dynamic range CMOS imager with pixel-parallel A/D conversion," IEEE Symposium on VLSI Circuits, Digest of Technical Papers, 2000, p. 24-27.
M. Kelly, C. Colonero, B. Tyrrell, and K. Schultz. "The Digital Focal Plane Array (DFPA) Architecture for Data Processing On-Chip". MSS Detectors. Feb. 2007.
M. Kelly, R. Berger, C. Colonero, M. Gregg, J. Model, D. Mooney, E. Ringdahl, "Design and testing of an all-digital readout integrated circuit for infrared focal plane arrays." Proceedings of SPIE, vol. 5902, 2005, pp. 105-115.

Mandl, W., "12 Mega-pixel, 1,000 fps Visible Camera With a Nanowatt A/D Converter at Each Pixel," *SPIE Proceedings* 5883:1-12 (Aug. 2005).
Mandl, W., "A Photon to Digital Photo Diode Imaging Array," (Apr. 2001).
Mandl, W., "Advances in on Focal Plane A/D With Low Power Optical Readout," *SPIE Proceedings* 3379:473-482 (Apr. 1998).
Mandl, W., "An Instrument Quality Digital Camera That Transitioned to Low Cost High Volume Production," *SPIE Proceedings* 4818:230-241 (Jul. 2002).
Mandl, W., "Four Kiloframe, 14 bit, 128X128 Digital Imaging Spectrometer," *SPIE Proceedings* 4486:385-392 (Aug. 2001).
Mandl, W., "Low Power MWIR Sensor With Pixel A/D Achieves 32 Bit Quantization Level at 30 FPS," *SPIE Proceedings*, vol. 6206, (Apr. 2006).
Mandl, W., "The Design of a 12 Mega-Pixel Imager With a Nanowatt A/D Converter at Each Pixel," *SPIE Proceedings* 5074:208-221 (Apr. 2003).
Mandl, W., "Visible Light Imaging Sensor With A/D Conversion at the Pixel," *SPIE Proceedings* 3649:1-13 (Jan. 1999).
Mandl, W., and Ennulat, Dr. Reinhard, "Space Based Digital LWIR HgCdTe Staring Focal Plane Array Design," *SPIE Proceedings* 3061:884-894 (Apr. 1997).
Mandl, W., et al., "A LWIR Focal Plane With Digital Readout Demonstrating a Passive Free-Space Optical Readout Link," *SPIE Proceedings* 3698:736-747 (Apr. 1999).
Mandl, W., et al., "Images and Test Results of MOSAD All digital 640X480 MWIR Prototype Camera," *SPIE Proceedings* 4131:355-363 (Jul. 2000).
Mandl, W., et al., "MOSAD IR Focal Plane Per Pixel A/D Development," *SPIE Proceedings* 2745:90-98 (Apr. 1996).
Mandl, W., et al., "Stream Vision, A Digital Imaging and Display Technology," *SPIE Proceedings* 3759:325-337 (Jul. 1999).
Mandolesi, et al., "A Scalable and Programmable Simplicial CNN Digital Pixel Processor Architecture", IEEE Transactions on Circuits and Systems—1: Regular Papers, vol. 51, No. 5, May 2004.
Mandolesi, et al., "A simplicial CNN Visual Processor in 3D SOI-CMOS", ISCAS 2006, Johns Hopkins University downloaded on Feb. 25, 2009 from IEEE Xplore.
Martijn, H.H., et al., "On-Chip Analog to Digital Conversion for Cooled Infrared Detector Arrays," *Proceedings of SPIE* 4028:183-191 (2000).
Melkonian, L.G., "Dynamic Specifications for Sampling A/D Converters," National Semiconductor Application Note 769:pp. 1-8 (May 1991).
Mendis, S. Kemeny, S.E., and Fossum, E.R., "CMOS Active Pixel Image Sensor," IEEE Transactions on Electron Devices, vol. 41, No. 3, Mar. 1994.
Notice of Allowance dated Jan. 13, 2012, in U.S. Appl. No. 11/415,007.
Office Action dated Apr. 21, 2011 in U.S. Appl. No. 11/415,007.
Office Action dated May 12, 2010 for U.S. Appl. No. 11/415,007.
Office Action on U.S. Appl. No. 11/978,351, Dated Oct. 18, 2010.
Office Action dated Sep. 15, 2011 in U.S. Appl. No. 11/415,007.
Office Action dated Jun. 17, 2013, in U.S. Appl. No. 13/299,995, pp. 1-26.
Practical Analog Design Techniques, Section 8, *Analog Devices* (1995).
R. Graham, et. al., "Signal processing on the focal plane array: an overview," Proceedings of SPIE—vol. 4130, Dec. 2000, pp. 237-244.
Revolutionary New Chip Delivers Better Pictures, and Breakthrough Chip Delivers Better Digital Pictures for Less Power: Tiny cameras could run for years, Digital Photography Review, http://www.dpreview.com/news/0512/05121201new_chips.asp (Sep. 14, 2006).
Rizk,et al., "Flexible Readout and Integration Sensor (FRIS): New Class of Imaging Sensor Arrays Optimized for Air and Missile Defense", Johns Hopkins APL Technical Digest, vol. 28, No. 3 (2010).
S.Mendis, S.E. Kemeny and E.R. Fossum, CMOS active pixel image sensor, IEEE Trans. Electron Devices, vol. 41(3), pp. 452-453 (1994).

(56) References Cited

OTHER PUBLICATIONS

S.E. Kemeny, T.J. Shaw, R.H. Nixon, and E.R. Fossum, Parallel processor array for high speed path planning, in Proc. 1992 IEEE Custom Integrated Circuits Conf., pp. P.6.5/1-5, Boston, MA, May 1992.

Specifying A/D and D/A Converters, National Semiconductor Application Note 156, pp. 1-6 (Feb. 1976).

Stobie, J.A.; Hairston, A.W.; Tobin, S.P.; Huppi, Rj.; Huppi, R. "Imaging sensor for the geosynchronous imaging Fourier transforn1 spectrometer (GIFTS)." Proceedings of the SPIE—The International Society for Optical Engineering, v 4818, 2002, p. 213-18.

T. Hamamoto, Y. Egi, M. Hatori, K. Aizawa, T. Okubo, H. Maruyama, and E.R. Fossum, Computational image sensors for on-sensor-compression, Proc. 5th International Conf. on Microelectronics for Neural Networks and Fuzzy Systems (MicroNeuro'96) IEEE Comp. Soc. Press, pp. 297-304 (1996).

Tadayyon, S., "A Pixel-Level A/D Converter for the Imaging Array of an Advanced Interferometer," Dept. of Electrical Engineering and Computer Science, Massachusetts Institute of Technology, pp. 1-84 (May 7, 1999).

Tech Notes, "Digital Focal-Plane Array"; Lincoln Laboratory, dowloaded from http://222.II.mit.edu/publications/technotes/TechNote_DFPA.pdf on Sep. 21, 2010.

The Medipix1 Chip (PCC), downloaded from http://medipix.web.cern.ch/MEDIPIX/Medipix1/medipix1.html, Oct. 23, 2001, 2 pgs.

Y. Yung and A. Bermak, "A Digital CMOS Imager with Pixel Level Analog-to-Digital Converter and Reconfigurable SRAM/Counter," Proceedings of the 4th IEEE International Workshop on System-on-Chip for Real-Time Applications (2004).

Yang, D.X.D., et al., "A Nyquist-Rate Pixel-Level ADC for CMOS Image Sensors," *IEEE J. of Solid-State Circuits* 34(3):348-356 (Mar. 1999).

Z. Zhou, B. Pain, R. Panicacci, B. Mansoorian, J. Nakamura, and E.R. Fossum, *On-focal-plane ADC: Recent progress in on-focal plane ADCs*, in *Infrared Readout Electronics III*, Proc. SPIE vol. 2745, pp. 111-122 Orlando, FL Apr. 1996.

\* cited by examiner

METHODS AND APPARATUS FOR COUNTING PULSES REPRESENTING AN ANALOG SIGNAL

CROSS-REFERENCE TO RELATED PATENT APPLICATION

This application claims the benefit, under 35 U.S.C. §120, of U.S. application Ser. No. 14/073,338, now U.S. Pat. No. 9,159,446, filed Nov. 6, 2013, and entitled "Methods And Apparatus For In-Pixel Filtering In Focal Plane Arrays Including Apparatus And Method For Counting Pulses Representing An Analog Signal," which in turns claims the benefit, under 35 U.S.C. §120, of U.S. application Ser. No. 13/228,367, now U.S. Pat. No. 8,605,853, filed Sep. 8, 2011, and entitled "Methods and Apparatus for In-Pixel Filtering in Focal Plane Arrays," which in turn claims the priority benefit, under 35 U.S.C. §119(e), of U.S. Provisional Application No. 61/503,918, filed Jul. 1, 2011, and entitled "Methods and Apparatus for In-Pixel Filtering in Focal Plane Arrays." Each of these applications is hereby incorporated herein by reference in its entirety.

GOVERNMENT SUPPORT

This invention was made with Government support under Contract No. FA8721-05-C-0002 awarded by the U.S. Air Force. The Government has certain rights in the invention.

BACKGROUND

Focal plane arrays (FPAs) are two-dimensional arrays of photodetectors disposed in the focal plane of a lens for imaging, spectrometry, lidar, wave-front sensing, and other applications. Conventional FPAs typically provide analog readouts, with the analog signals generated at the pixel level converted to digital signals by external analog-to-digital converters (ADCs). Once converted by the external ADCs, the digital signals may be processed according to the demands of a particular application.

Fundamental limitations on the photodetector dynamic range, active area, and readout noise floor limit the practical scalability of conventional FPAs. For example, decreasing the size of capacitors used to store accumulated photocurrents causes the data transfer rate (also known as the frame rate) to increase beyond acceptable limits. Similarly, electronics noise and ringing limit the amount of data that can be transmitted on a single output tap to maintain the desired signal-to-noise ratio (SNR) and dynamic range. Attempting to scale conventional analog technology to meet more demanding performance requirements leads to an FPA that is significantly large and complex, and consumes excessive power for most applications.

SUMMARY

In some examples of focal plane arrays, each pixel of the FPA may be referred to as a "unit cell" that includes circuitry for processing electric signals associated with the pixel. In various implementations, each unit cell may include one or more of: 1) a photodetector to receive incident radiation and provide an analog electric signal in response to the incident radiation; 2) an analog-to-digital converter (an "in-pixel ADC") to convert the analog electric signal to a digital signal; and 3) additional circuitry (e.g., digital logic) to process the digital signal and provide pixel data output (such additional circuitry also is referred to herein generally as "in-pixel digital processing circuitry"). Accordingly, it should be appreciated that, in some implementations, respective unit cells of an array may not necessarily include the photodetector itself, but instead include only the in-pixel ADC, and in some cases in-pixel digital processing circuitry to process the digital signal output by the in-pixel ADC (i.e., the analog signal applied to the in-pixel ADC is received from an external source). Furthermore, in some implementations, the digital signal output by the ADC may in some instances be provided directly as pixel data output for the corresponding pixel, while in other instances, this digital signal may be further processed by the in-pixel digital processing circuitry to provide the pixel data output.

In some implementations of such arrays, the digital signal provided as an output of an in-pixel ADC may include a series of pulses (e.g., via an in-pixel ADC implemented as a voltage-to-frequency or current-to-frequency converter). In such implementations, the series of pulses serving as the digital signal may be applied to the in-pixel digital circuitry, which in turn provides the pixel data output. The inventors have recognized and appreciated that, by providing additional circuitry in each pixel that may be flexibly configured to receive the series of pulses and implement various digital processing functionality on the series of pulses within a given pixel, a wide variety of advantageous processing (e.g., filtering) techniques may be realized. Moreover, the inventors further have recognized and appreciated that by extending such flexibility of configuring in-pixel digital circuitry to respective pixels of an array (e.g., the in-pixel digital circuitry of respective pixels may be configured to perform identical or different digital processing functionality), a number of rich processing capabilities may be realized in an array architecture.

In view of the foregoing, various inventive methods, apparatus and systems disclosed herein relate generally to digital processing circuitry disposed in respective pixels of an array, in which such digital processing circuitry may be flexibly configured/controlled to function in various operating modes within a given pixel, and/or in similar or different operating modes from pixel to pixel in the array. In various embodiments, variably controllable in-pixel digital processing circuitry may be particularly configured to process digital signals in the form of a series of pulses, and such circuitry may be implemented in any of a variety of manners (generally based at least in part on digital logic). Examples of in-pixel digital processing circuitry contemplated by various embodiments disclosed herein include, but are not limited to, one or more of the following elements, alone or in combination: logic gates, flip-flops, registers (e.g., shift registers), multiplexers, digital counters, and the like. In some implementations, in-pixel digital processing circuitry may be implemented in the form of one or more "state machines" having multiple selectable operating modes to provide pixel data output based on a series of pulses applied to the state machine(s).

As noted above, in various aspects, in-pixel digital processing circuitry for a given pixel may be controllable to function in one of multiple possible operating modes to provide various processing functionality in connection with a received series of pulses. Furthermore, respective in-pixel digital processing circuitry of multiple pixels in an array similarly may be controlled to provide various processing functionality, independently of one another, such that similar or different digital processing functionality may be realized amongst multiple pixels in the array.

More specifically, in one exemplary embodiment, an apparatus according to the inventive concepts described herein is implemented as a digital focal plane arrays (DFPAs) comprising multiple unit cells. Each unit cell includes an analog-to-digital converter (ADC) to convert an analog signal (e.g., representing radiation incident on a photodetector) to a digital signal. In one aspect, the digital signal include a series of pulses. Each unit cell further comprises in-pixel digital processing circuitry to receive the series of pulses and provide pixel output data based at least in part on the series of pulses. In another aspect, the in-pixel digital processing circuitry comprises multiple independently controllable counters that may be respectively configured to function in one of multiple operating modes (e.g., count up, count down) to provide various processing functionality in connection with the series of pulses. In yet another aspect, each of the multiple counters in a given pixel may receive a control signal (e.g., provided by an external controller) to select a particular operating mode of the counter. In yet other aspects, such multiple counters in a given pixel may be controlled so as to select particular respective operating modes to provide a wide variety of in-pixel digital processing functionality; furthermore, in-pixel digital processing circuitry of multiple pixels (each including multiple counters) may be independently controlled (to select similar or different operating modes for the in-pixel digital processing circuitry of different pixels in the array) so as to implement various filtering techniques.

In sum, one embodiment of the present invention is directed to an apparatus for counting pulses in a series of pulses representing an analog signal. The apparatus comprises an integrated circuit including a plurality of unit cells. The plurality of unit cells comprise a first unit cell including first in-pixel digital circuitry, and a second unit cell including second in-pixel digital circuitry. The first in-pixel digital circuitry receives a first series of pulses representing a first analog signal, and further receives a first control signal to select at least one of a plurality of first operating modes for the first in-pixel digital circuitry to process the first series of pulses. The second in-pixel digital circuitry receives a second series of pulses representing a second analog signal, and further receives a second control signal to select at least one of a plurality of second operating modes for the second in-pixel digital circuitry to process the second series of pulses. In one aspect, the first control signal and the second control signal are provided such that the at least one first operating mode for the first in-pixel digital circuitry and the at least one second operating mode for the second in-pixel digital circuitry are different. In another aspect, the first in-pixel digital circuitry includes at least one first state machine, and the second in-pixel digital circuitry includes at least one second state machine, wherein the at least one first state machine and the at least one second state machine are independently controllable based at least in part on the first control signal and the second control signal.

Another embodiment is directed to an apparatus for counting pulses in a series of pulses representing an analog signal. The apparatus comprises an integrated circuit including a plurality of unit cells. At least one unit cell in the plurality of unit cells comprises a plurality of counters operably configured to count at least one pulse in the series of pulses representing the analog signal, wherein at least one counter in the plurality of counters is configured to be switched from a first operating mode to a second operating mode independently of operating modes of the other counters in the plurality of counters.

Another embodiment is directed to a method of counting pulses in a series of pulses representing an analog signal in at least one unit cell in an array of unit cells, wherein the at least one unit cell comprises a plurality of counters. The method comprises: switching at least one counter in the plurality of counters from a first operating mode to a second operating mode independent of operating modes of other counters in the plurality of counters; and changing a count in the at least one counter in response to at least one pulse in the series of pulses.

Another embodiment is directed to an apparatus for counting pulses representing an analog signal. The apparatus comprises: (A) a photodetector array comprising at least one photodetector to produce a photocurrent at an intermediate frequency in response to detection of a modulated signal and a local oscillator signal; (B) a clock to provide in-phase and quadrature clock signals at the intermediate frequency; and (C) an integrated circuit operably coupled to the photodetector array and the clock, the integrated circuit comprising a plurality of unit cells. At least one unit cell in the plurality of unit cells comprises: (i) a converter to convert the photocurrent from the at least one photodetector in the photodetector array to a series of pulses,
(ii) an in-phase counter to count pulses in the series of pulses in response to the in-phase clock signal, and
(iii) a quadrature counter to count pulses in the series of pulses in response to the quadrature clock signal.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

DETAILED DESCRIPTION

Figure 1:
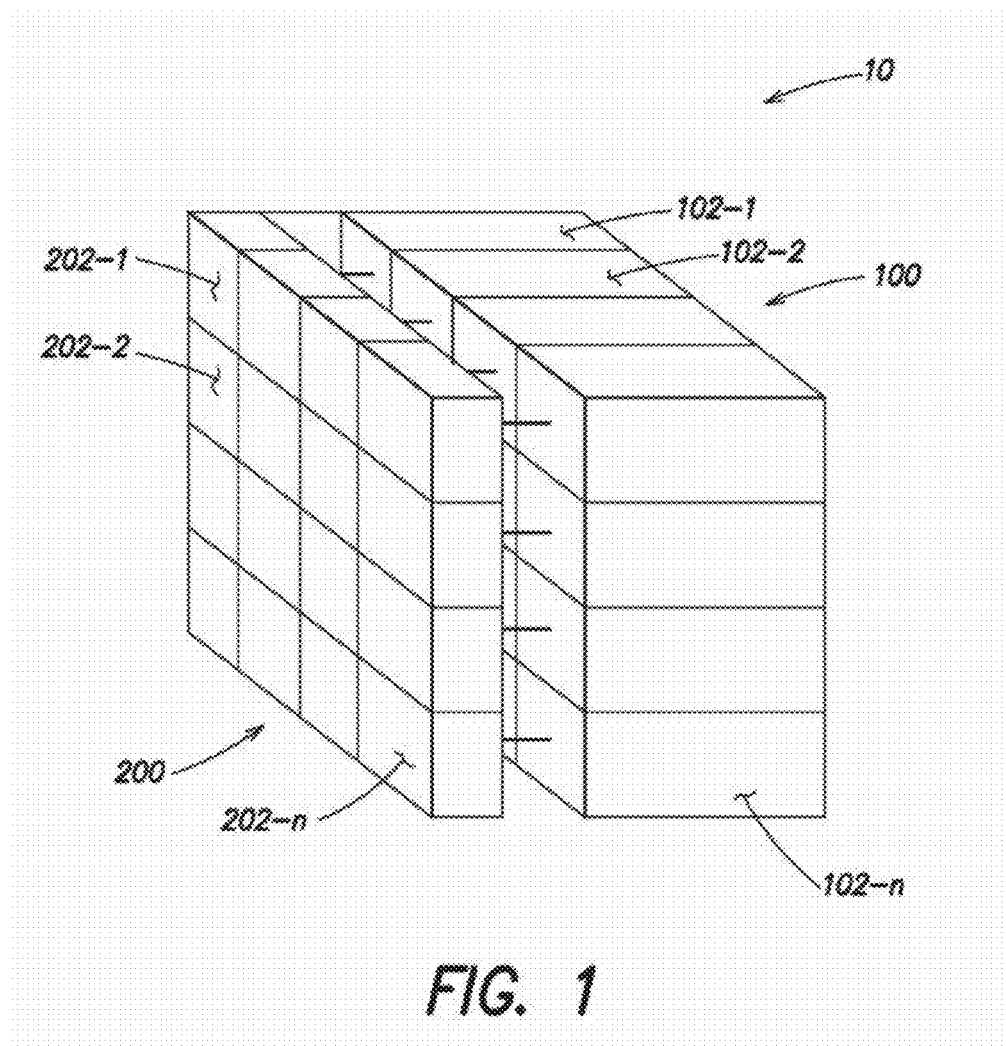
FIG. 1 is a diagram of a two-dimensional photodetector array coupled to a digital pixel read-out integrated circuit, according to one embodiment of the present invention.

Following below are more detailed descriptions of various concepts related to, and embodiments of, inventive methods, apparatus and systems for in-pixel filtering in focal plane arrays. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes.

Various inventive methods, apparatus and systems disclosed herein relate generally to digital processing circuitry disposed in respective pixels of an array, in which such digital processing circuitry may be flexibly configured/controlled to function in various operating modes within a given pixel, and/or in similar or different operating modes from pixel to pixel in the array. In various embodiments, variably controllable in-pixel digital processing circuitry may be particularly configured to process digital signals in the form of a series of pulses, and such circuitry may be implemented in any of a variety of manners (generally based at least in part on digital logic). Examples of in-pixel digital processing circuitry contemplated by various embodiments disclosed herein include, but are not limited to, one or more of the following elements, alone or in combination: logic gates, flip-flops, registers (e.g., shift registers), multiplexers, digital counters, and the like. In some implementations, in-pixel digital processing circuitry may be implemented in the form of one or more "state machines" having multiple selectable operating modes to provide pixel data output based on a series of pulses applied to the state machine(s).

In various aspects, in-pixel digital processing circuitry for a given pixel may be controllable to function in one of multiple possible operating modes to provide various processing functionality in connection with a received series of pulses. Furthermore, respective in-pixel digital processing circuitry of multiple pixels in an array similarly may be controlled to provide various processing functionality, independently of one another, such that similar or different digital processing functionality may be realized amongst multiple pixels in the array.

More specifically, some embodiments of the present invention include digital focal plane arrays (DFPAs) with multiple unit cells, each of which includes an analog-to-digital converter (ADC) coupled to multiple independently controllable counters. The ADC converts analog data, such as photocurrent from a detector array, to digital data that is counted by and stored in the independently controllable counters.

For the purposes of the present disclosure, "a plurality of independently controllable counters" is a set of two or more counting elements in which the operating mode of each counting element can be selected regardless of the operating mode of the other counting element(s) in the plurality of independent controllable counters. In other words, the setting of an independently controllable counter in a given unit cell is not contingent on the setting of any other counter in the given unit cell.

Illustrative counters can be controlled independently by logic in the form of respective control signals and/or respective switches as described below. For instance, logic in the unit cell may activate (and deactivate) the counters in the unit cell and shift data among the counters in the unit cell. The logic, in conjunction with inter-cell transfer circuitry, can also shift data from the counters in one cell to counters in other unit cells and/or to external memory or external processors. For more on transferring data among unit cells, see U.S. Patent Application Publication No. 2007/0075888 and U.S. Patent Application Publication No. 2010/0226495, each of which is incorporated herein by reference in its entirety.

The independently controllable counters in inventive DFPAs can be used to apply one or more temporal filters, facial filters, and/or spatial-temporal filters simultaneously to imagery directly on the focal plane. For example, the counters in an inventive DFPA may implement multiple matched spatial filters to find signals of interest within an image. Inventive DFPAs may also perform focal-plane intensity thresholding of match-filtered images to eliminate irrelevant information, such as background signal or static elements. Matched filtering, intensity thresholding, and other processing capabilities of inventive DFPAs can be used to reduce off-chip data rates and processing needs for sensors and systems. In addition, inventive DFPAs can also be used to reduce the size(s) of sensors and sensing systems because they eliminate the need for external processors.

Digital Focal Plane Arrays with Independently Controllable Counters

FIG. 1 illustrates the architecture of a typical DFPA 10, which includes a read-out integrated circuit 100 operably coupled (e.g., bump-bonded) to an optional two-dimensional photodetector array 200. Although the DFPA 10 shown in FIG. 1 uses a photodetector array to provide analog signals, it should be understood that other implementations can use other types of sensors. The photodetector array 200 includes a plurality of photodetectors (respectively indicated in FIG. 1 as photodetectors 202-1 through 202-*n*; collectively indicated as photodetectors 202). Each photodetector 202 in the photodetector array 200 supplies an analog signal in the form of a photocurrent to a corresponding unit cell (respectively indicated in FIG. 1 as unit cells 102-1 through 102-*n*; collectively indicated as unit cells 102). Unit cells 102 are also referred to herein as pixels. A significant advantage of the DFPA architecture lies in the on-chip signal processing capabilities due to in-pixel digitization. In a preferred embodiment, the on-chip digitization is controlled via a single-instruction multiple data (SIMD) architecture, with each pixel serving as a parallel processing element.

Figure 2:
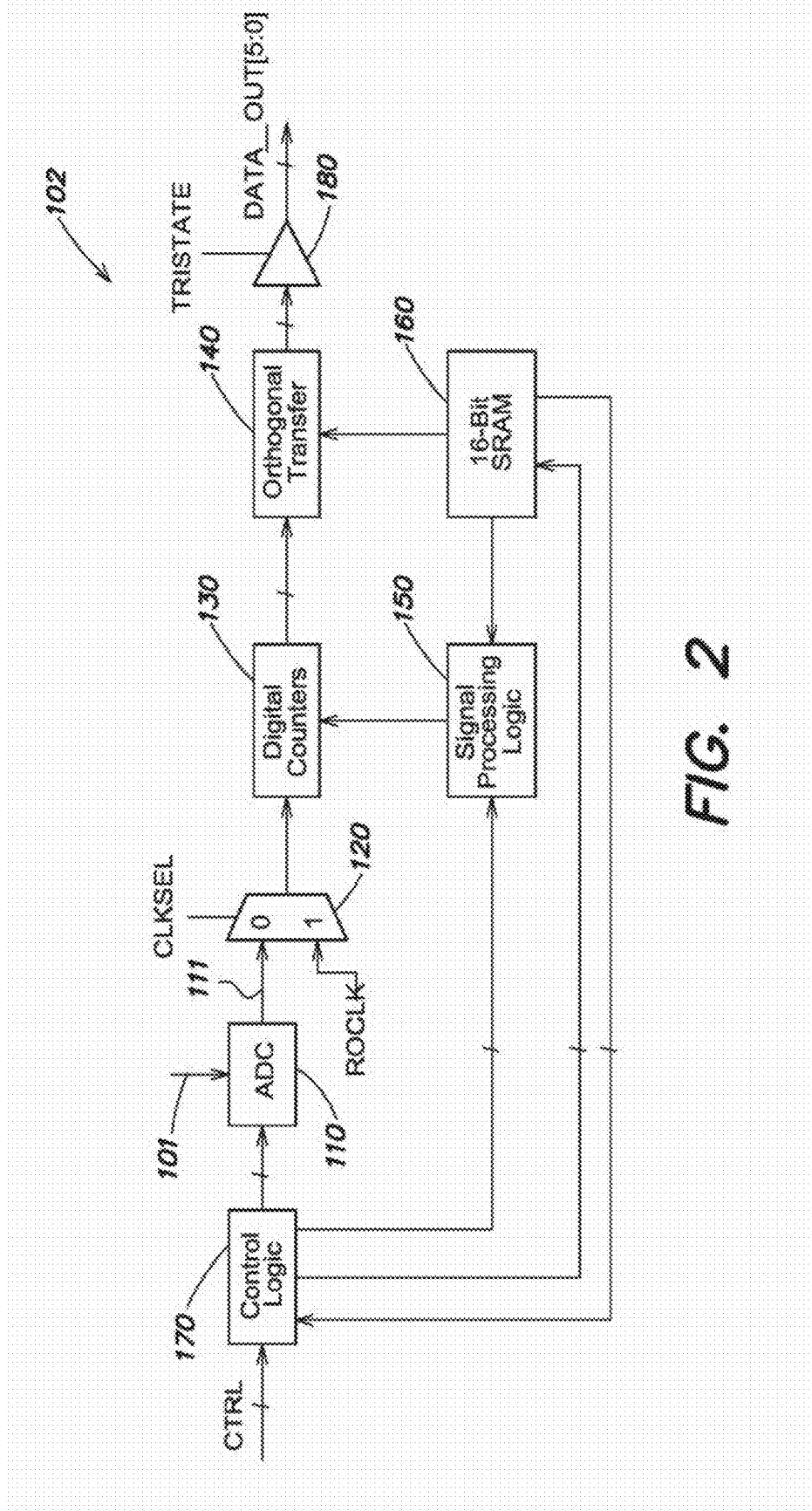
FIG. 2 is a diagram of a unit cell in the read-out integrated circuit of FIG. 1, according to one embodiment of the present invention.

FIG. 2 is a block diagram of a unit cell 102 in the integrated circuit 100 of FIG. 1. An ADC 110 receives an analog signal 101 from the photodetector 102 or other source and converts the analog signal 101 to a series of pulses 111. In some cases, the ADC 110 may include a current-to-frequency converter that charges a capacitance with photocurrent representing the analog signal 101. Alternative ADCs may include a voltage-to-frequency converter or other pulse-emitting device. Once the capacitance becomes charged to a predetermined threshold representing the magnitude of the unit cell's least significant bit, the capacitance emits a pulse 111. Varying the magnitude of the capacitance (e.g., by charging the capacitance to a predetermined level before integrating the analog signal) changes the magnitude represented by the least significant bit. Charging the capacitance more quickly (e.g., by applying a larger photocurrent to the capacitance) causes the capacitance to emit pulses 111 more frequently.

A multiplexer 120 coupled to the ADC 110 receives the pulses 111 and couples the pulses 111 to a set of independent controllable digital counters 130 depending on the state of a binary control signal CLSEL. When the binary control signal CLSEL is in a first state (e.g., a logical high state), the multiplexer 120 couples an externally provided read-out clock signal ROCLK to the counters 130 to shift data out of the counters 130 as described below. When the binary control signal CL_SEL is in a second state (e.g., a logical low state), the multiplexer 120 couples the pulses 111 to one or more of the counters 130.

Each counter 130 may increment or decrement its respective count in response to the pulses 111 depending on its respective state, which is set by signal processing logic 150 and control logic 170. The counters 130 store the accumulated pulses 111, or counts, as digital data that can be shifted among counters 130 in the unit cell 102 and transferred out of the unit cell 102. Exemplary counters 130 can be implemented by grouping together D flips-flops in an asynchronous ripple counter that can also be used as a shift register to shift data into adjacent unit cells 102 by asserting the binary control signal CLKSEL and providing the external readout clock ROCLK as described above. When the counters 130 are in shift register mode, orthogonal transfer circuitry 140 couples digital data stored in the counters via an output buffer 180 (described below) according to instructions from the signal processing logic 150 and/or control logic 170.

Independently Controllable Counters

Figure 3:
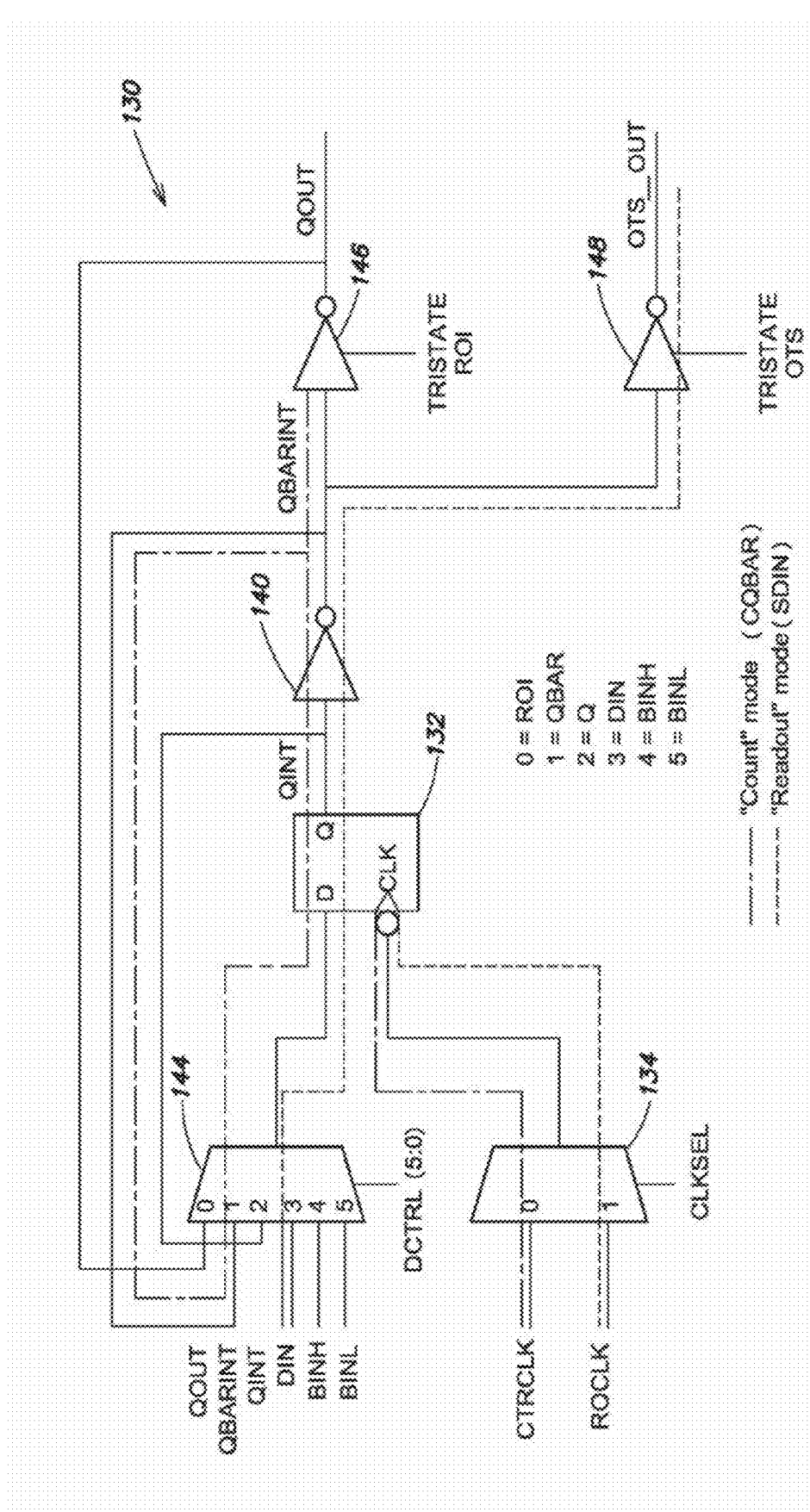
FIG. 3 is a block diagram of an independently controllable counter that can be switched between an asynchronous counting mode and a shift register mode, according to one embodiment of the present invention.

FIG. 3 is a schematic diagram of an independently controllable, counter 130. The counter includes a negative edge-triggered D flip-flop 132 that stores one bit of information. As understood by those of skill in the art, the D flip-flop 132 has a data input D, a clock input CLK, and an output Q that represents the bit latched in the D flip-flop 132. The D flip-flop 132 may also have an output QBAR (not shown) that is the complement of the output Q. A 6:1 configuration multiplexer 144 and a 2:1 clock selection multiplexer 134 are used to configure the counter 130 to act as a toggle flip-flop in an asynchronous ripple counter, a shift register stage, or a synchronous toggle-flop flop depending on the settings of one-hot signals DCTRL[5:0] and CLKSEL.

Depending on the operating mode, the configuration multiplexer 144 selects one of the following input signals: QOUT, which is the output of the unit cell 102; QINT, which is the output of the D flip-flop 132; QBARINT, which is the complement of the output of the D flip-flop 132; DIN, which receives data from another counter 130 in the unit cell 102 and/or from other unit cells 102 in the DFPA 10; BINH, which is an arithmetic shift right operation; and BINL, which is a rotate left operation . . . . Similarly, the clock selection multiplexer 134 selects between the counter clock CTRCLK and read-out clock ROCLK. Other independently controllable counter architectures fall within the scope of the present invention, including independently controllable counters with more flip-flops (e.g., to store more than one bit of data) storage elements other than flip-flops, and/or different switching arrangements. In addition, other counters may include multiplexers with fewer or more inputs depending on the desired application.

The control inputs to the multiplexers 134 and 144 set the counter 130 to operate in any of the operating modes listed in TABLE 1 (below). The operating mode determines which of the two clocks and six data inputs feed into the flip-flop 132. The first letter of the operating mode name corresponds to the input clock: C is for the ripple counter clock and S corresponds to the readout, or shift, clock. The counter clock is used for counting operations when integrating photocurrent, and the readout clock is used for shifting data into adjacent pixels and performing other synchronous operations.

The subsequent letter(s) of each mode name correspond to the data input selected by the configuration multiplexer 144 using the one-hot select signal DCTRL[5:0]. Region of interest (ROI) mode is for a region of interest write operation, described in greater detail below. The input for this mode comes from the bidirectional QOUT bus. When the ROI tristate buffer is tristated, the QOUT bus is driven with ROI write data by the QCOL and QROW buses rather than the value stored in the D flip-flop 132. QBAR inputs the negated version of the flip-flop output to toggle the D flip-flop 132. Q inputs the positive version of the flip-flop output so that the D flip-flop 132 holds state regardless of the clock input. This is a safe mode that can be used when the clock inputs are changed to prevent unexpected clock pulses. DIN is for the external data input, which shifts in data from an adjacent unit cell and can be used for an OTS shift or to read data out of the array. BINH is for an arithmetic shift right (ASR), and BINL is for a rotate left (ROL). Both are part of the barrel shifter functionality.

The MODE signal is the external input that is used to control the counting mode. The MODE control signal includes six bits, of which the lower four control the counter clock and input data. The upper two bits select the orthogonal shift direction. DCTRL and CLKSEL are both internal signals that are generated from MODE[3:0]. DCTRL[5:0] is a one-hot control signal which selects one of the six flip-flop inputs. CLKSEL selects between the ripple counter clock and the readout clock. When CLKSEL is high, the pixel is in readout mode; when it is low, the pixel is in counter mode. Note that CLKSEL corresponds directly to MODE[3].

The sixteen modes listed in TABLE 1 implement significant functionality for the independently controllable counter 130 (and the unit cell 102 that includes the counter 130). The CQBAR mode is used for normal counting operation when reading data from the photodiode array. The SROI mode is used to write data from the ROI row and column buses into a pixel. The SQBAR mode is used to toggle the counter for a ones complement negation.

The SDIN mode shifts data in from an adjacent pixel. The shift direction is determined by MODE[5:4]. The SBINH mode is used to perform an arithmetic right shift and the SBINL mode is used to perform a left rotate. The CQ and SQ modes are used as safe modes when the input clock is changed. For example, if the counter is operating in CQBAR mode, to change to SQBAR mode, one can first change to CQ mode, then SQ mode, then SQBAR, to ensure that the counter 130 sees only the intended clock pulse. To ensure that more than one DCTRL bit is not selected during a transient condition, the COPEN and SOPEN mode should be used as an intermediate step between mode transitions.

Setting one-hot control signals DCTRL[5:0] and CLKSEL to choose input QBARINT and the counter clock CTR_CLK puts the counter 130 into an asynchronous ripple counter mode in which it accepts the complement output from another counter 130 in the same unit cell 102. For shift register operation, the one-hot control signals DCTRL[5:0] and CLKSEL are set to choose input DIN and the shift register read-out clock RO_CLK and for synchronous complement, the one-hot control signals DCTRL[5:0] and CLKSEL are set to input QBARINT and shift register read-out clock RO_CLK. The input QINT can be used to avoid unwanted data corruption during mode transitions, as any spurious clock edges then have no effect. In other examples, the counter 130 may operate in a count-up mode in which it increments its stored count in response to a pulse 111; a count-down mode in which it decrements its stored count in response to a pulse 111; an inactive or sleep mode in which it does not respond to pulses 111; and/or a shift mode in which it transfers data via an inverter 140 and a pair of tristate buffers 146 and 148, which can be used to gate the counter output as described below.

TABLE 1

Example encoding of counter/register modes using DCTRL

| Mode Name | CLKSEL | DCTRL[5:0] | Operating Mode |
|---|---|---|---|
| CROI | 0 | $000001_2$ | |
| CQBAR | 0 | $000010_2$ | Ripple Count Mode |
| CQ | 0 | $000100_2$ | Protect State used in Mode Transition |
| CDIN | 0 | $001000_2$ | |
| CBINH | 0 | $010000_2$ | |
| CBINL | 0 | $100000_2$ | |
| COPEN | 0 | $000000_2$ | State Transition |
| COPEN2 | 0 | $000000_2$ | |
| SROI | 1 | $000001_2$ | Random-Access Read-In |
| SQBAR | 1 | $000010_2$ | Ones Complement |
| SQ | 1 | $000100_2$ | Protect State used in Mode Transition |
| SDIN | 1 | $001000_2$ | Shift in Data |
| SBINH | 1 | $010000_2$ | Right Shift |
| SBINL | 1 | $100000_2$ | Left Shift |
| SOPEN | 1 | $000000_2$ | State Transition |

Referring again to FIG. 3, two paths in the counter 130 are illustrated: a count mode path (dot/dash line) and a readout mode path (dotted line). In count mode (CQBAR), the inverter 140 provides an output QBARINT, which is the complement of the flip-flop output Q, feeds back into the data input D of the D flip-flop 132. In some counting modes, the counter clock CLK may be supplied by the output from another counter 130 in the unit cell. In an asynchronous ripple counting mode, for instance, two or more independently controllable counters 130 may be arranged in series such that the output of the first counter 130 in the series serves as the input to the second counter 130 in the chain and so on. Alternatively, the input to the counter clock CLK may be one or more pulses 111 from the ADC 110 (FIG. 2). In readout mode (SDIN), the shift clock is active, and the flip-flop input D is set to the DIN bus, which is connected to the OTS tristate inverter 146 of an adjacent counter 130 in the same unit cell.

The counter 130 shown in FIG. 3 performs bidirectional counting using ones complement synchronous negation instead of performing an up/down count operation. Specifically, the counter performs a complement-count-complement operation to get a result equivalent to a backwards count operation. To perform ones complement negation of the counter value, the D flip-flop 132 can be toggled using the QBAR input. This corresponds to counter mode SQBAR, or readout clock with negated input. For background subtraction or change detection, the counter 130 can be configured to count up and then count down, each for the same integration period. To count up, the normal counting mode is used. To count down, the value of the counter is negated using one's complement, and counting continues. A second ones complement negation completes the down counting operation to restore the D flip-flop's positive value.

Alternatively, replacing the complement bubble on the D flip-flop 132 with an XOR gate allows for true count-down operation. In this implementation, if the output of clock multiplexor 134 is connected to one input of the XOR and a direction control signal is connected to the other input, then the direction control signal can be used to choose either count-up or count-down operation.

The independently controllable counter 130 also includes a first tristate inverter 146 and a second tristate inverter 148 that provide random access readout and synchronous shift register readout of data stored in the D flip-flop 132. Each tristate inverter 146, 148 inverts the complement output signal QBARINT when its respective control signal is asserted to provide an output that matches the bit stored in the D flip-flop 132. In shift register readout mode, data is output to an adjacent counter via an output OTS_OUT of the orthogonal transfer tristate inverter 148. In random access readout mode, the counter 130 emits data via an output QOUT of the ROI tristate buffer 146.

Together, the inverters 146 and 148 form a gating circuit used to ensure that the counter 130 does not perform any unnecessary switching activity. Enabling the second tristate inverter 148 while clocking the counter 130 with the readout clock RO_CLK (e.g., by asserting the clock select signal CLKSEL) causes the second tristate inverter 148 to output the value stored in the D flip-flop 132 when in synchronous count mode, but not in asynchronous ripple count mode. Preventing the counter 130 from broadcasting its value while it is counting is a power saving feature.

An alternative implementation that can accommodate both counting and shifting includes a logic gate, such as a NAND gate, instead of a tristate inverter. Referring again to FIG. 3, the tristate inverter outputting OTS_OUT can be replaced by a NAND gate with inputs QBARINT and CLKSEL. In this case, the NAND gate prevents unnecessary toggles on the shift register output node OTS_OUT during count mode.

Segmented Counter Structures

Figure 4:
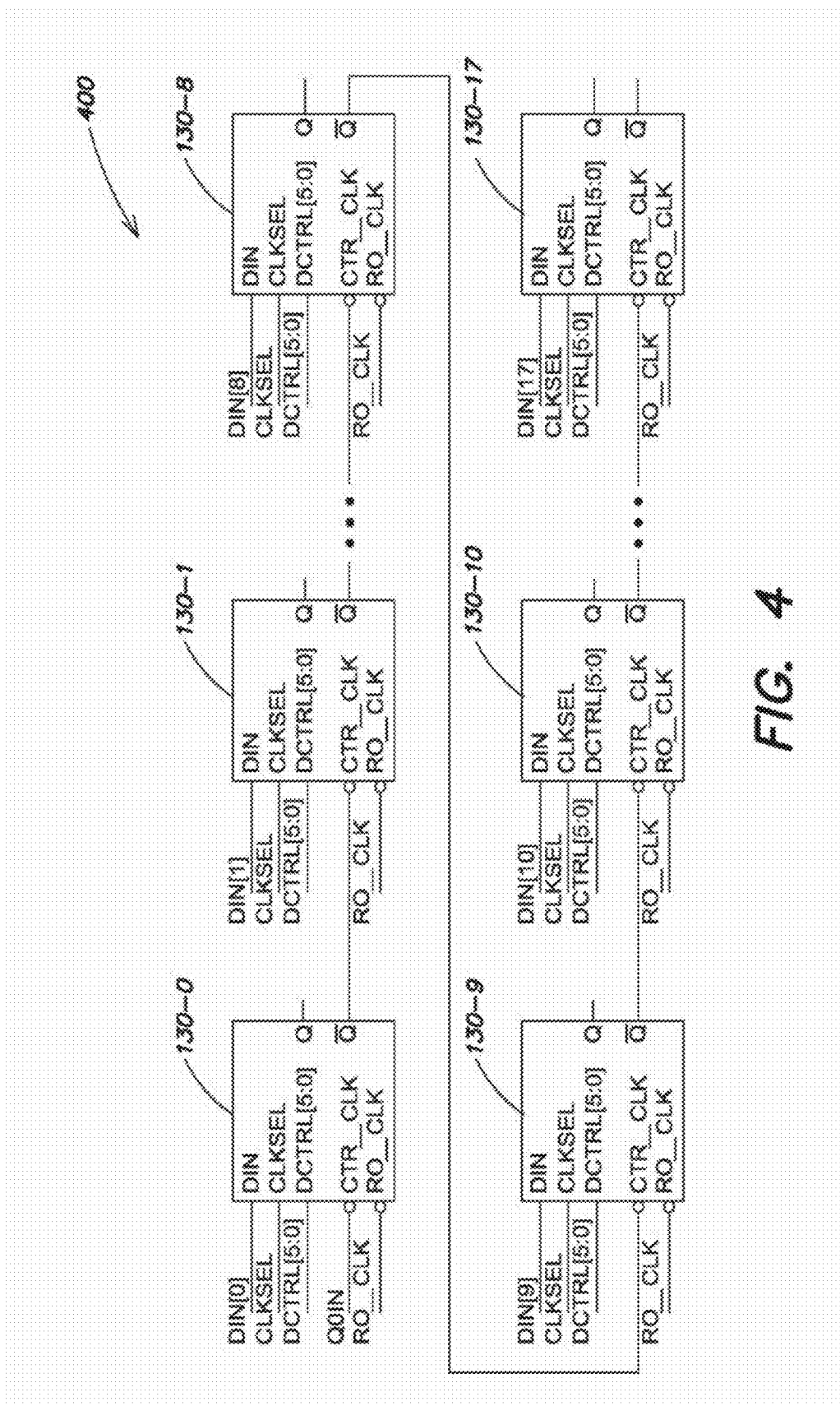
FIG. 4 is a block diagram that shows a segmented counter architecture including eighteen of the independently controllable counters shown in FIG. 3 coupled together in series and configured to operate in count and shift modes, according to one embodiment of the present invention.

FIG. 4 shows an eighteen-bit, segmented counter structure 400 that can be configured to perform multiple simultaneous measurements, multiplication and/or division of stored data, ripple counting, and/or data transfer with low power dissipation and makes efficient use of unit cell area. The counter structure 400 includes eighteen segments—shown in FIG. 4 as one-bit independently controllable counters 130—linked together in series (labeled in FIG. 4 as counters 130-0 through 130-17, respectively; collectively, counters 130) whose inputs and/or operating mode(s) can be set with an external one-hot control signal DCTRL[5:0] and a clock select signal CLKSEL. Those of skill in the art will readily appreciate that other counter structures within the scope of the present invention may have more or fewer counters, counters with different number(s) of bits, counters with different operating modes, etc. In addition, the unit cell, read-out integrated circuit, DFPA, and/or external source(s) may supply independent control signals to one or more counters within inventive counter structures.

To count pulses from an analog source, such as the ADC 110 in FIG. 2, with the counter structure 400, the clock select signal CLKSEL is set to count mode (e.g., set to a logical low value), and the one-hot signal DCTRL[5:0] selects the appropriate input signal to feed into each counter 130. In ripple counting mode, pulses 111 from the ADC 110 (FIG. 2) feed the zero-order counter 130-0. On the falling-edge triggered clock input CTR_CLK, the complementary output QBAR from the zero-order counter 130-0 drives the input CLK of the first-order counter 130-1, the complementary output QBAR from the first-order counter 130-1 drives the clock input CLK of the second-order counter 130-2, and so on. The output from the highest-order counter 130-17 in the counter structure 400 may coupled to another unit cell 102 or other circuitry in the integrated circuit 100 via one or more (optional) buffers, if desired. Thus, counter 130-0 represents the least significant bit, counter 130-1 represents the second least significant bit, and so on up to counter 130-17, which represents the most significant bit.

As described above, the counters 130 in the segmented counter structure 400 can be switched from counting mode(s) to read-out mode by changing the clock select signal CLKSEL, e.g., from a logical low value to a logical high value or vice versa. Switching the counter structure 400 from count mode to shift mode causes the counter structure 400 to behave as a shift register, where each counter 130 in the counter structure 400 transfers stored data to the next counter 130 in the counter structure 400 (e.g., counter 130-2 transfers data to counter 130-3). For an integrated circuit 100 with a six-bit data bus connecting adjacent unit cells 102 and eighteen one-bit counters 130 per unit cell, it may take three clock cycles to transfer all eighteen bits from one unit cell 102 to an adjacent unit cell 102, other portion of the DFPA 10, or external memory (not shown).

Figure 5:
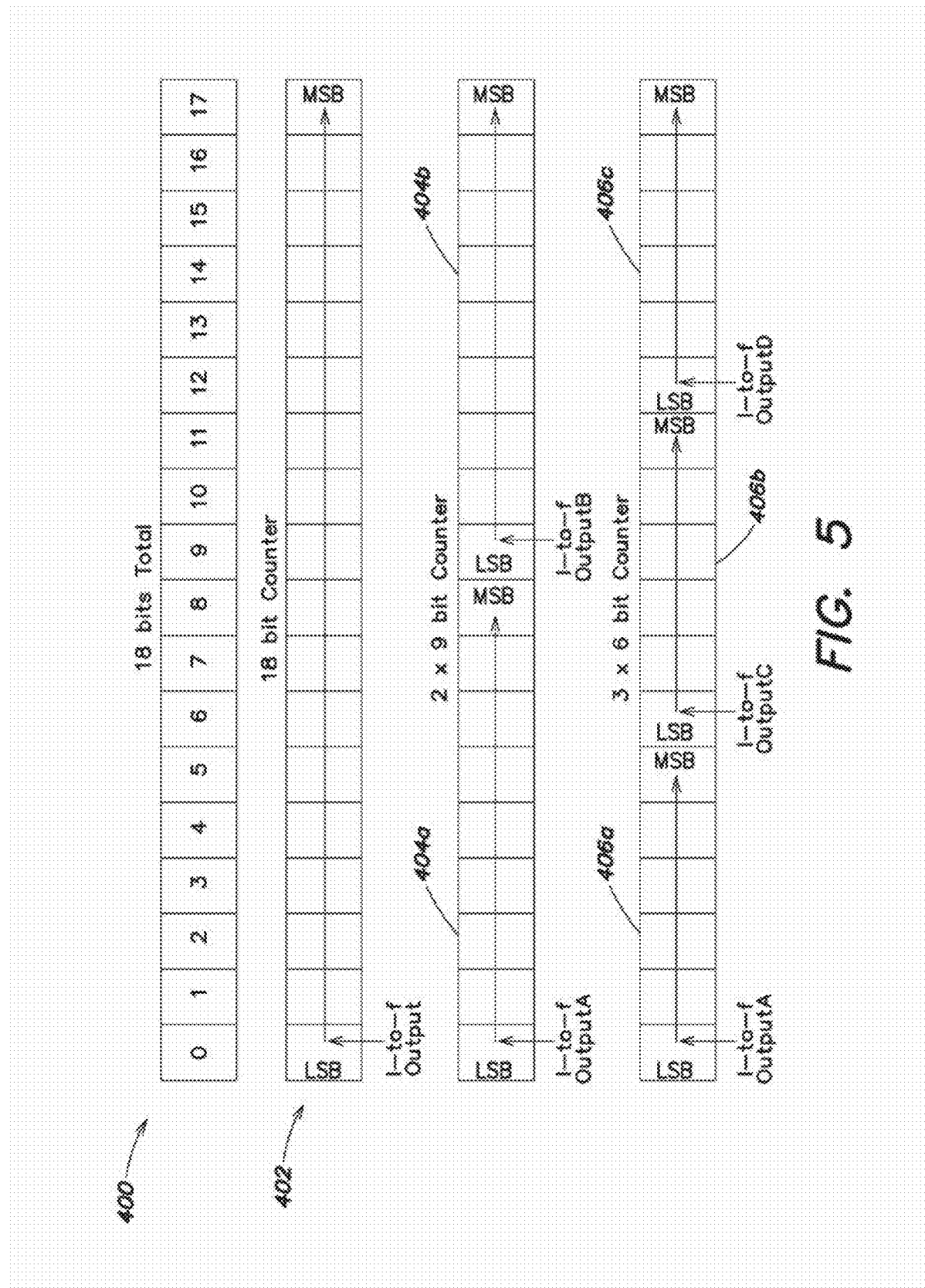
FIG. 5 illustrates how the segmented counter structure of FIG. 4 may be configured to provide different independently controllable counter segments, according to embodiments of the present invention.

FIG. 5 shows how the eighteen-bit segmented counter structure 400 of FIG. 4 can be configured as an eighteen-bit counter 402 and/or as independently controllable segments of different lengths using the control signals shown in TABLE 2 (below). For instance, control signals may divide the counter into two independently controllable nine-bit counters 404, three independently controllable six-bit counters 406, nine independently controllable two-bit counters, eighteen independently controllable one-bit counters, etc. The counter structure 400 can also be divided into segments of different lengths (e.g., a four-bit segment, a five-bit segment, and a nine-bit segment). For example, as illustrated in TABLE 2, supplying control bit mode signal BITMODE [2:0] and pulse gate signal PULSEGATE[3:0] and using a six-bit, three-bit, three-bit, six-bit cascade supports the three counter arrangements shown in FIG. 5.

TABLE 2

Segmented Counter Structure Control Signals

| Register Configuration | BITMODE |
|---|---|
| 18 bit | 000 |
| 12 bit + 6 bit | 001 |
| 9 bit + 9 bit | 010 |
| 9 bit + 3 bit + 6 bit | 011 |
| 6 bit + 12 bit | 100 |
| 6 bit + 6 bit + 6 bit | 101 |
| 6 bit + 3 bit + 9 bit | 110 |
| 6 bit + 3 bit + 3 bit + 6 bit | 111 |

Each segment (e.g., six-bit counter 406 or nine-bit counter 404) may be implemented as one or more concatenated independently controllable counters 130, each of which has pins for its own enable signals (GATE1, GATE2, etc.), and clock inputs as described above. Because each counter 130 can be enabled and/or clocked independently of the other counters 130 in the counter structure 400, each counter 130 can operate with a different integration time and/or implement a different filter kernel as described below. These segments are cascaded via either the configuration multiplexers 144 internal to each counter 130, external multiplexers coupled between counters of the counter structure, and/or other additional switches, which allows each subsequent segment to be clocked by either the MSB of the previous segment or an independent external clock.

Alternatively, the segments may be clocked independently with the output of one or more ADCs. For a unit cell 102 (FIG. 2) with an ADC 110 that includes a current-to-frequency converter, voltage-to-frequency converter, or other pulse-emitting ADC, the external clocks (CLK1, CLK2, etc.) may correspond to pulses 111 emitted by the ADC 110. In unit cells with multiple pulse-emitting ADCs, each clock 130 and/or each segment may be connected to the output of a different ADC.

Shifting and Operating on Data with Segmented Counter Structures

Referring again to FIG. 3, the configuration multiplexer 144 in each individual independently controllable counter 130 has a "DIN" port that allows for data to be shifted in, e.g., from a different unit cell 102 in the DFPA 10. It is also possible to use the data input port DIN to perform shift-based operations, including a barrel shift, which is useful for performing power-of-two multiplication and division and for other purposes. In shift-based operating modes, the DIN input of each counter 130 in the counter structure 400 or segment of the counter structure 400 is connected to the output of an adjacent bit (next higher or lower in significance). For an arithmetic shift, the counter representing the LSB or MSB is connected to a reset value (e.g., ground GND), which may be selected to allow for sign extension. For a rotate operation, the output of the counter representing the MSB is connected to the input of the counter representing the LSB.

In barrel shift mode, a group of counters 130 in shift-register mode shifts a data word by a specified number of bits in one clock cycle. The counters 130 in the segmented counter structure 400 (FIG. 4) can be switched to (and/or from) barrel shift mode using the external input signal DCTRL[5:0]. Specifically, the lower four bits of DCTRL[5:0] specify the inputs of the counters 130 for barrel shifting. These counter modes and the corresponding values of DCTRL[3:0] are given in TABLE 1. Counter mode SBINL and the BINL counter input correspond to a rotate left operation (i.e., a left shift), and counter mode SBINH and the BINH counter input correspond to an arithmetic shift right operation (i.e., a right shift). Based on the configuration of the counter structure 400, the bitmode signals (BITMODE [0:2]) given in TABLE 2 select between the shift value and the counter value for correct shifting operation.

Figure 6:
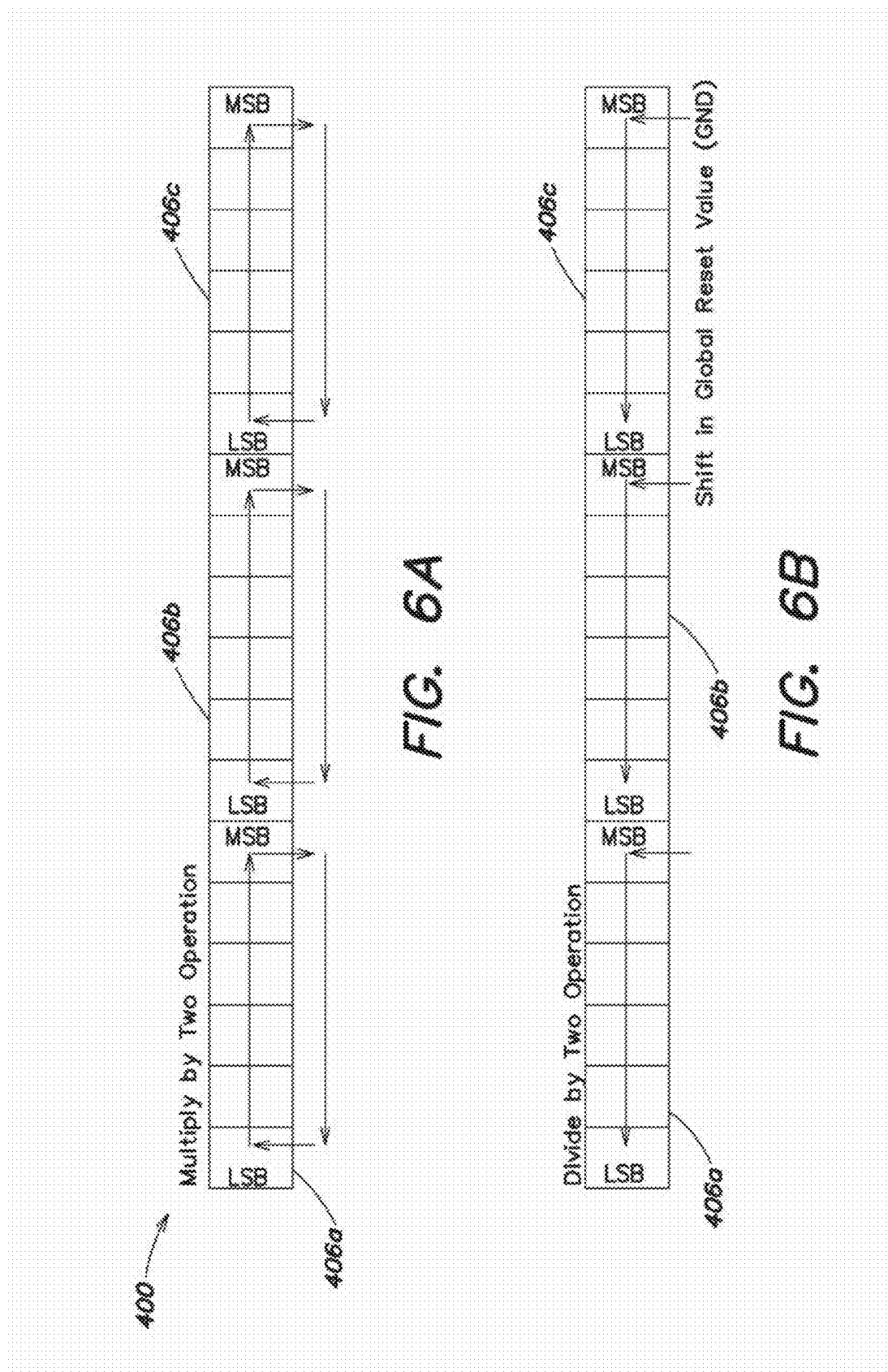
FIGS. 6A and 6B illustrate how multiple independently controllable counters can be configured to perform multiplication and division, respectively, according to embodiments of the present invention.

FIG. 6A shows an implementation of a multiply-by-two operation using an eighteen-bit counter structure 400 split into three six-bit counter segments 406a, 406b, and 406c (collectively, six-bit counters 406). In each counter segment 406, the output of the counter representing the MSB drives the input of the counter representing the LSB.

FIG. 6B shows an implementation of a divide-by-two operation using an eighteen-bit counter structure 400 split into three six-bit counter segments 406. In the embodiment illustrated in FIG. 6B, the input of the counter representing the MSB is connected to a global reset value equal to ground (GND). If a sign extension is desired (thus implementing an arithmetic shift right operation), then the MSB counter input should instead be connected to the MSB counter output during right shift mode.

Random Access of Values Stored in a Counter Structure

For some applications, a nondestructive random access approach for reading out data is more desirable than the synchronous shift register approach described above. For example, a nondestructive local query is particularly useful for reading out one or more particular regions of interest (ROI) or sampling the counter states at multiple sample times within a single integration period. Furthermore, it may be beneficial in some signal processing applications to preload counters 130 in one or more unit cells 102 without changing the contents of other unit cells 102 in the integrated circuit 100.

Figure 7:
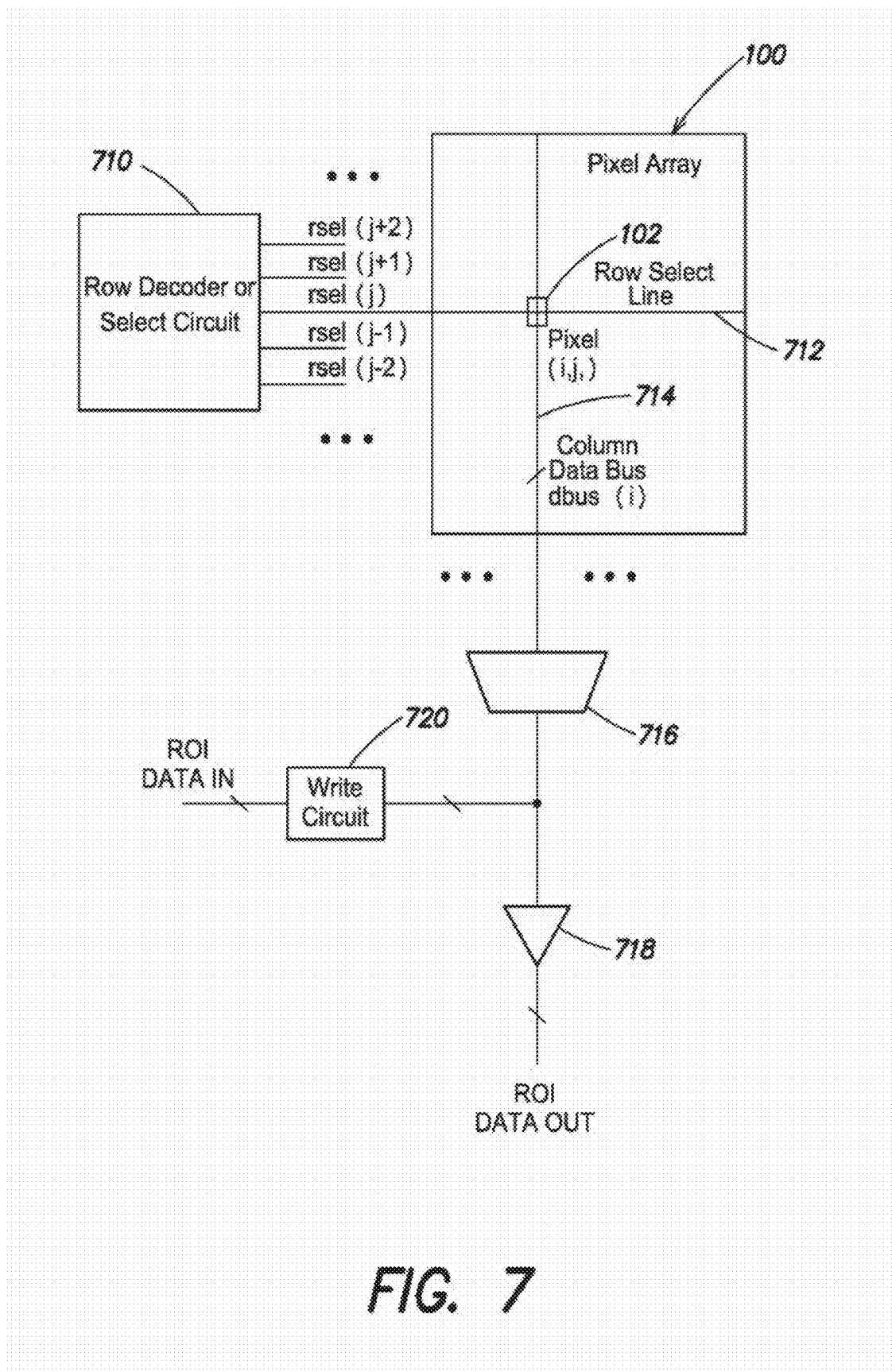
FIG. 7 is a block diagram of a two-dimensional read-out integrated circuit that provides random access to data in each unit cell, according to one embodiment of the present invention.

FIG. 7 illustrates one implementation of random access of pixel values. The output QOUT in each unit cell 102 in the integrated circuit 100 is electrically coupled to a wire of a column data bus 714 and to a row select line 712. During a read operation, a row decoder 710 coupled to the row select lines 712 selects a particular row (e.g., row j) of unit cells 102 by emitting a one-hot row decoder output (e.g., rsel(j)). The ROI tristate inverter 146 in each unit cell 102 on the selected row responds to the row decoder output by driving the digital value of its unit cell 102 (e.g., unit cell i) onto the corresponding wire of the column data bus 714 (e.g., dbus (i)). A sense amplifier 718 coupled to the column data bus 714 senses the voltage on each wire of the data bus 714 and converts the sensed voltage into a corresponding digital bit that may then be read out.

The column bus 714 can also accommodate write operations in which data is preloaded into one or more counters 130 in each of one or more unit cells 102 in the read-out integrated circuit 100. During a write operation, a write circuit 720 generates a voltage corresponding to ROI input data and couples the voltage to one or more selected unit cells 102 in a ROI along a selected column data bus 714 via an optional multiplexer 716. Referring to FIG. 3, the tristate inverters 146 in the selected unit cells 102 are set to tristate mode, and the control input DCTRL is set to "ROI" mode, e.g., using the row decoder 710. In other words, the configuration multiplexer 144 in each selected unit cell 102 is set clock data on input QOUT (from the QOUT node of the tristate inverter 146) into the D flop-flop 132. The row decoder 710 may be used to locally configure the input DCTRL so that one or more rows of unit cells 102 are set to receive the input QOUT while the other unit cells 102 in the integrated circuit 100 are set to receive the input QINT.

Temporal Filtering with Multiple Independently Controllable Counters Per Unit Cell DFPAs with multiple independently controllable counters per unit cell can be used to filter incident signals in the time domain by incrementing, decrementing, and/or transferring data among counters in each unit cell and/or among counters in different unit cells. They also enable new sensing modalities, such as coherent detection, for improved receiver sensitivity and optical dispersion compensation. For example, the simultaneous application of temporally matched filters in one or more unit cells can be used to estimate the amplitude and phase of one or more (pixel) or groups of pixels in a signal image, e.g., through in-phase and quadrature demodulation (described below).

On-chip spatial filtering can be implemented using the up/down counting and array shifting functions. Additionally, in-pixel temporal matched filters can be utilized to detect intermediate-frequency signals while rejecting out-of-band noise and/or clutter components. To enable parallel execution of multiple processing functions, e.g., dual in-phase and quadrature detection in the case of coherent detection, or the implementation of multiple spatial filters in image processing applications, the counters 130 in each unit cell 102 of the DFPA 10 can be split N times producing N+1 separate counter segments, and each counter segment can be driven by the same ADC as described above. The integration and up/down counting of each counter can be independently controlled.

In-Phase and Quadrature Demodulation with Two Counters Per Unit Cell

Specifically, inventive DFPAs can be used as temporally matched filters in heterodyne and/or homodyne detection, in which light from a laser or other light source is reflected from an object (or otherwise modulated) to produce a signal beam that is imaged onto an array of photodetectors in a focal plane. As understood by those of skill in the art, reflection may introduce a Doppler shift or other modulation in the signal beam depending on the object's position and velocity with respect to the focal plane. Additional light from the laser is optically combined with the reflected light and interferes with the reflected light at the focal plane. This additional light, which may be delayed and/or shifted in frequency, is known as the local oscillator beam. Optical mixing at each detector in the focal plane results in an analog photocurrent whose frequency, which is referred to as the intermediate frequency (IF), is about equal to the difference between the frequencies of the local oscillator and signal beams and whose amplitude is proportional to the amplitude of the electric field of the signal beam.

Figure 8:
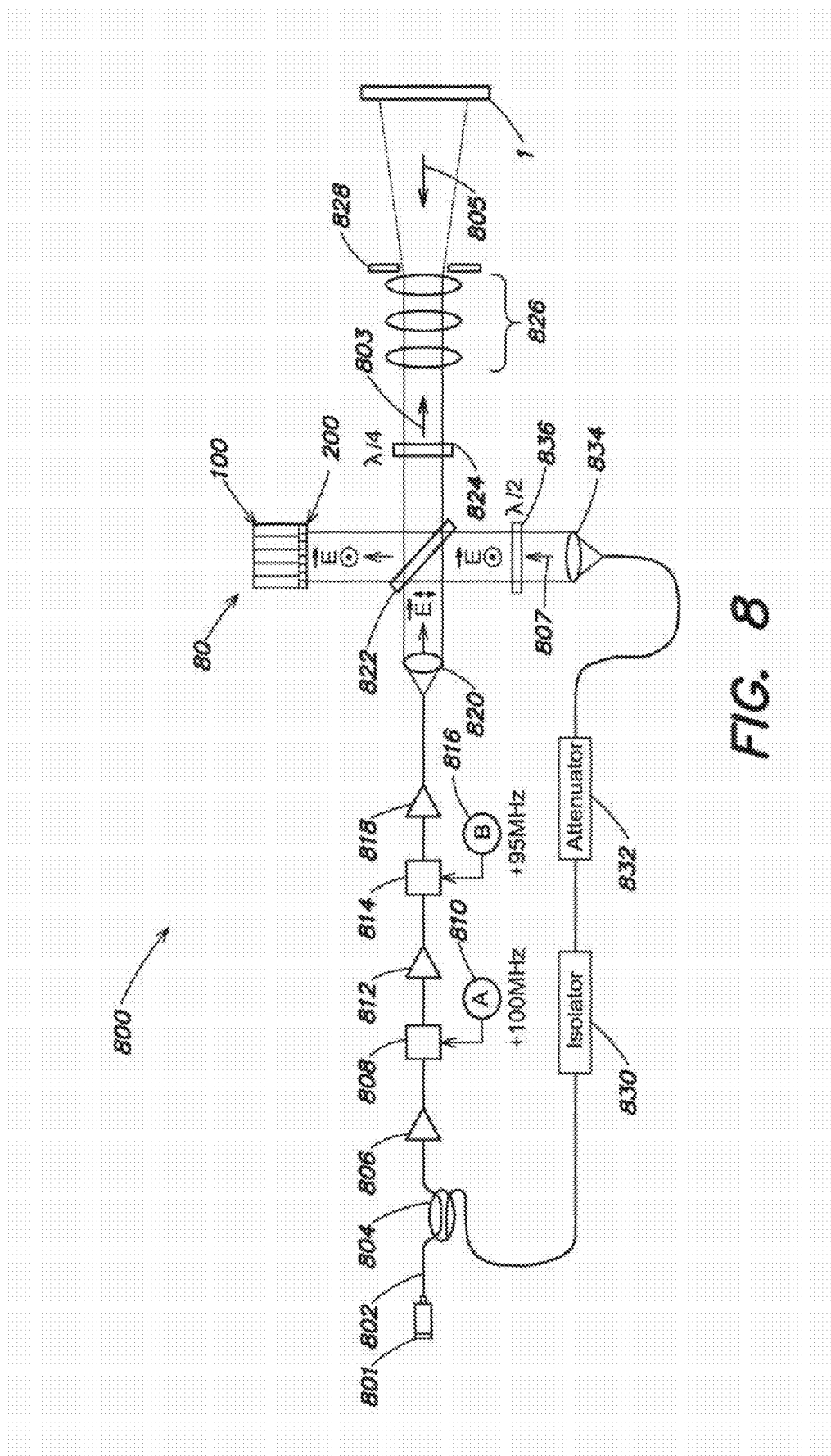
FIG. 8 is a diagram of a lidar system with a read-out integrated circuit configured to perform in-phase and quadrature filtering and demodulation of detected signals, according to one embodiment of the present invention.

FIG. 8 shows an exemplary lidar architecture 800 with a DFPA 80 configured to perform in-phase and quadrature demodulation. Light from a laser 801 propagates via an optical fiber 802 through an erbium-doped fiber pre-amplifier 806 that boosts the signal power by about 17 dB to a first acousto-optic modulator (AOM) 808, which is driven by a first synthesizer 810 with a tone at a frequency of 100 MHz. The first AOM 808 diffracts a positive first-order beam that is shifted up in frequency by 100 MHz with respect to the frequency of the laser beam, then amplified by another amplifier 812 before illuminating a second AOM 814 driven by 95 MHz tone from a second synthesizer 816. The second AOM 814 diffracts a negative first-order beam that is shifted down in frequency by 95 MHz to yield a transmitted beam 803 with a net frequency shift of 5 MHz with respect to the frequency of the laser beam. A high-power amplifier 818 amplifies the transmitted beam 803 before it exits the fiber 802.

A lens 820 collimates the transmitted beam 803, which is polarized in the plane of the page, as it propagates out of the fiber 802 through a polarizing beamsplitter 822, which transmits the entire beam 803. A quarter-wave plate 824 rotates the polarization of the transmitted beam 803 to a circular polarization state (e.g., left-handed circular) before the transmitted beam 803 is projected onto a target 1 via a zoom lens 826, which compensates for changes in range to the target 1, and an iris 828, which limits the amount of light coupled back into the system 800. The target 1 reflects a portion of the incident light to form a reflected beam 805 with a polarization orthogonal to that of the transmitted beam 803 (i.e., if the transmitted beam 803 has left-handed circular polarization, then the reflected beam 805 has right-handed circular polarization). This reflected beam 805 propagates back through the iris 828 and zoom lens 824 to the quarter-wave plate 824, which rotates the reflected beam's polarization to be perpendicular to the plane of the page. The polarizing beamsplitter 822 then reflects the reflected beam 805 onto the focal plane of a DFPA 80.

At the same time, a fiber beamsplitter 804 couples a fraction of the light from the laser 801 through an isolator 830, which prevents reflections from reaching the laser 801, and an attenuator 832 that reduces the beam's amplitude. A lens 834 collimates this additional beam 807, which is known as a local oscillator and polarized in the plane of the page with a half-wave plate 836, and directs it toward the DFPA 80. As understood by those of skill in the art, the local oscillator 807 may be frequency shifted with respect to the transmitted beam using, e.g., an AOM or other frequency shifter. (In this case, the first and second AOMs 808 and 816 introduce an equivalent shift of the frequency in the transmitted beam instead.) The difference in frequency between the local oscillator 807 and the transmitted beam 803 is referred to as the intermediate frequency.

The reflected beam 805 and the local oscillator 807 interfere with each other on the photodetector array in the DFPA 80. The non-linear (square-law) detection process performed at each photodetector in the DFPA 80 results in a sinusoidal signal whose amplitude is proportional to the amplitude of the reflected light and whose frequency is about equal to the intermediate frequency—here, 5 MHz—plus or minus phase shifts due to movement of and/or range delay to the target 1.

Temporal filtering within each unit cell (pixel) in the DFPA 80 can be used to demodulate the intermediate frequency signals and extract the amplitude and phase of the reflected beam 805. In particular, applying an in-phase temporal filter represented by a square wave (which can be implemented using up/down counting commands) modulated at the intermediate frequency and a quadrature temporal filter given by a square wave modulated at the intermediate frequency phase and shifted by 90 degrees relative to the in-phase filter signal yields the in-phase and quadrature components of the reflected beam 805. The signal amplitude can be estimated from its detected in-phase and quadrature components as $(I^2+Q^2)^{0.5}$; the signal phase can estimated by the arctangent of the in-phase and quadrature values.

Figure 9A:
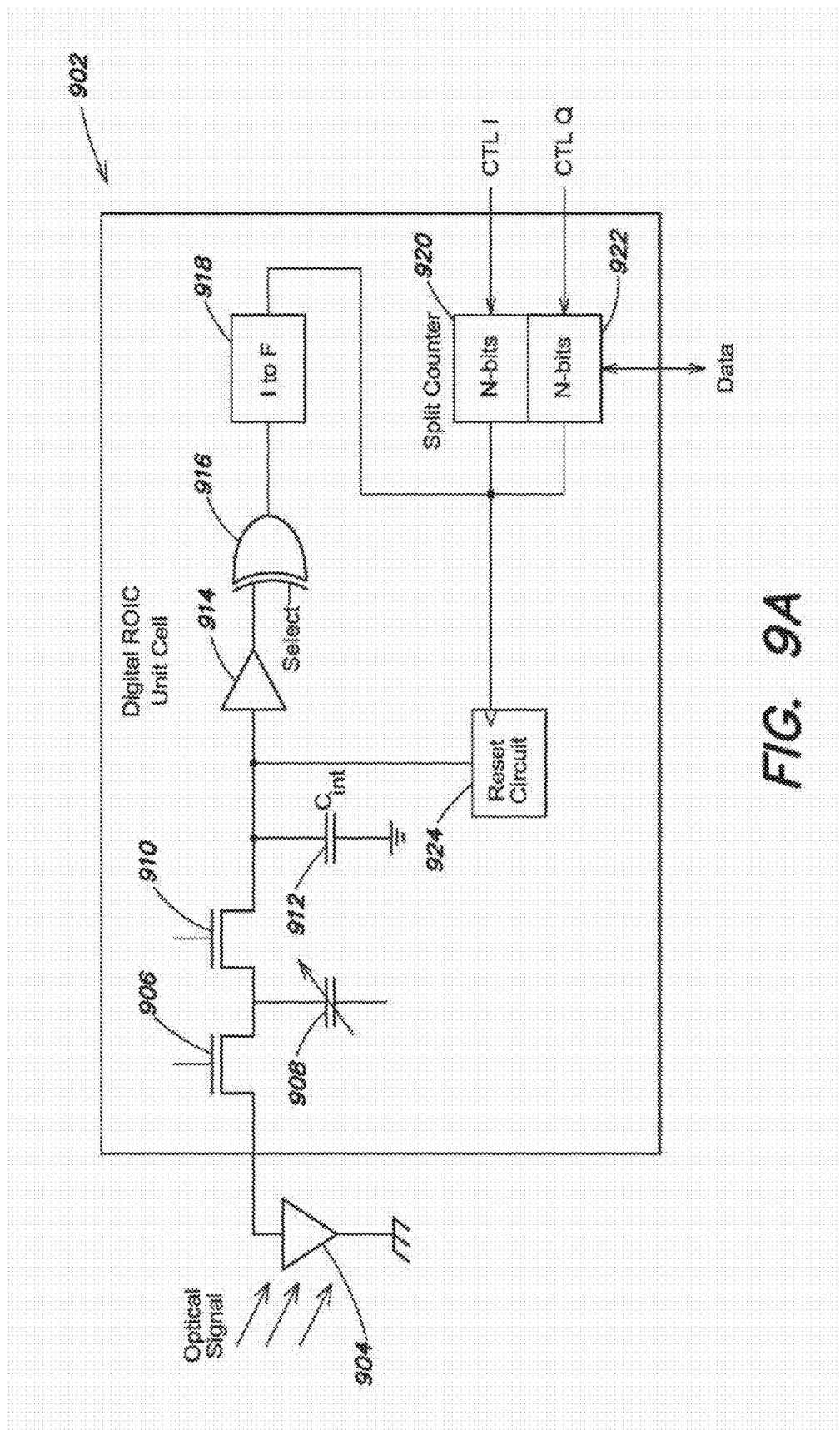
FIG. 9A is a diagram of a unit cell configured to perform in-phase and quadrature filtering and demodulation of detected signals as in the read-out integrated circuit of FIG. 8, according to one embodiment of the present invention.

FIG. 9A shows a unit cell 902 of the DFPA 80 (FIG. 8) with an in-phase counter 920 and a quadrature counter 922 for in-pixel in-phase and quadrature signal demodulation. The in-phase counter 920 and quadrature counter 922 can be implemented with separate counters or by configuring a segmented counter structure as described above. For instance, the eighteen-bit counter structure 400 of FIG. 4 can be split into two independently controlled nine-bit counter segments to provide the in-phase counter 920 and quadrature counter 922 shown in FIG. 9A.

A photodetector 904 operably coupled to the unit cell 902 transmits an analog photocurrent to a current-to-frequency converter 918 via a first transistor 906, a variable capacitor 908, a second transistor 910, a capacitor 912, an integrator 914, and an XOR gate 916 (all described in greater detail below). The output of the current-to-frequency converter 918 is applied simultaneously to the in-phase counter 920 and quadrature counter 922 via a multiplexor (not shown). Each counter 920 and 922 can be controlled to count up or down in many ways, such as using control signals CTL I and CTL Q to allow independent gating or actuation of the clock signals for each counter 920, 922. Digital data stored in each counter 920, 922 can be transferred independently to adjacent units cells, e.g., by selecting the appropriate counter operating modes and using the synchronous shift and/or random access techniques described above.

Figure 9B:
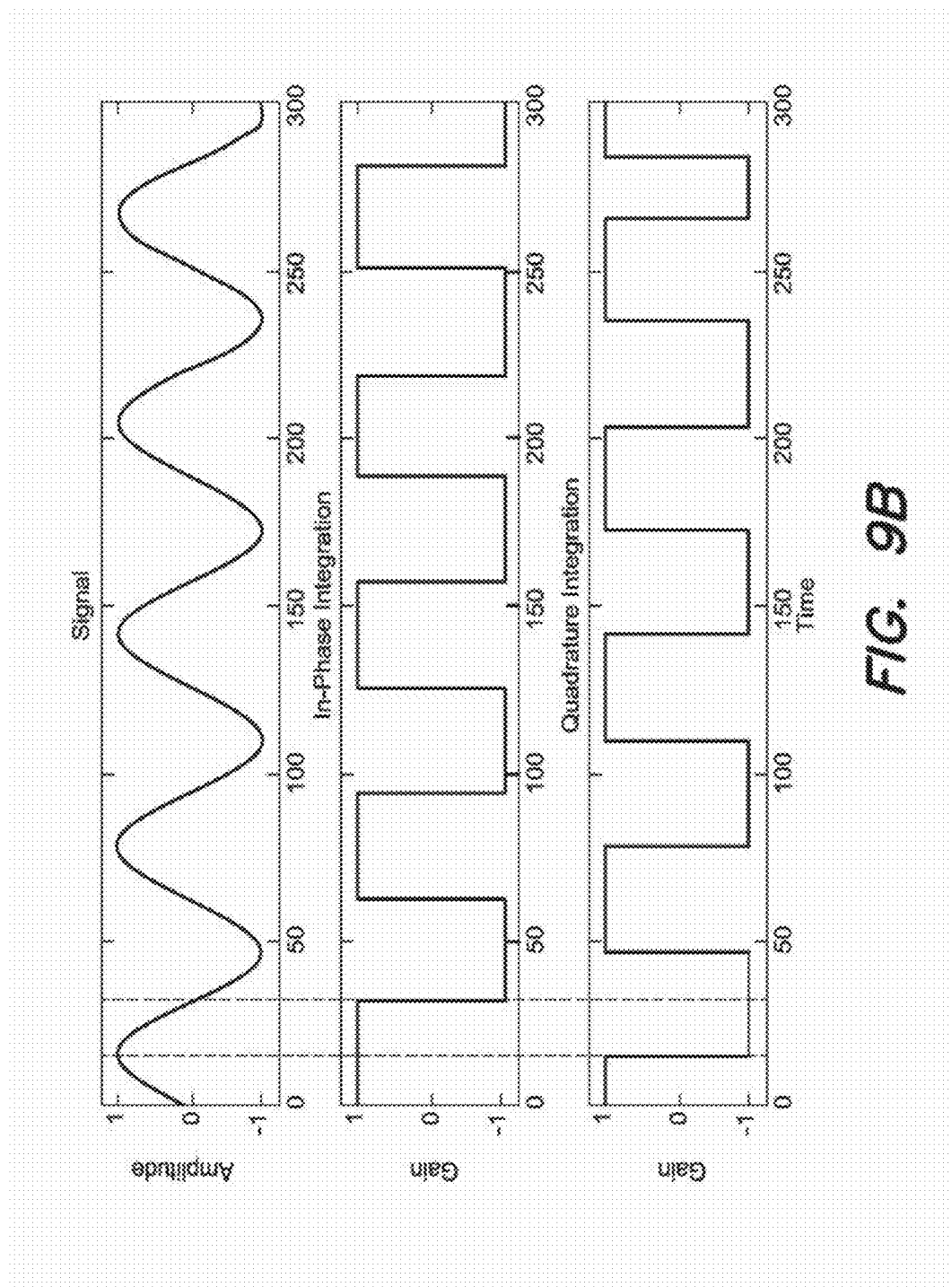
FIG. 9B includes plots of a clock signal, in-phase integration timing, and quadrature integration timing for the unit cell of FIG. 9A, according to one embodiment of the present invention.

In-pixel in-phase and quadrature demodulation is accomplished as follows. A clock (not shown) generates a sinusoid at the intermediate frequency, which is rectified to produce an in-phase control signal CTL I and a rectified, phase-shifted quadrature control signal CTL Q as shown in FIG. 9B. The in-phase counter 920 is toggled between count-up and count-down modes at a rate equal to the expected signal IF, and the quadrature-phase counter 922 is toggled as above with a 90-degree phase lag with respect to the in-phase counter 920. In this way the values of the in-phase and quadrature counters 920, 922 correspond to the expected in-phase and quadrature signals after the allotted signal integration time.

Figure 10A:
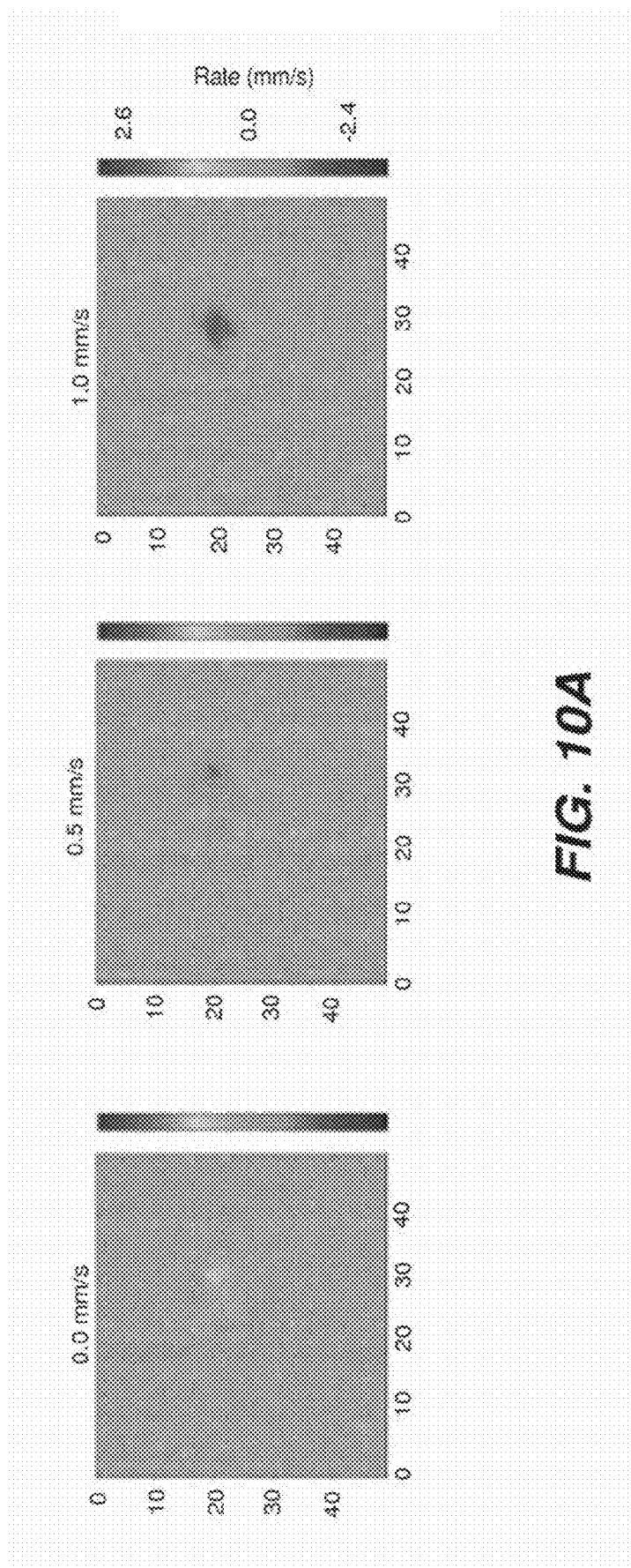
FIGS. 10A-10C are plots that indicate the position and velocity of a target moving away from a digital focal plane array, according to one embodiment of the present invention, at speeds from 0 mm/s to 4 mm/s.
Figure 10B:
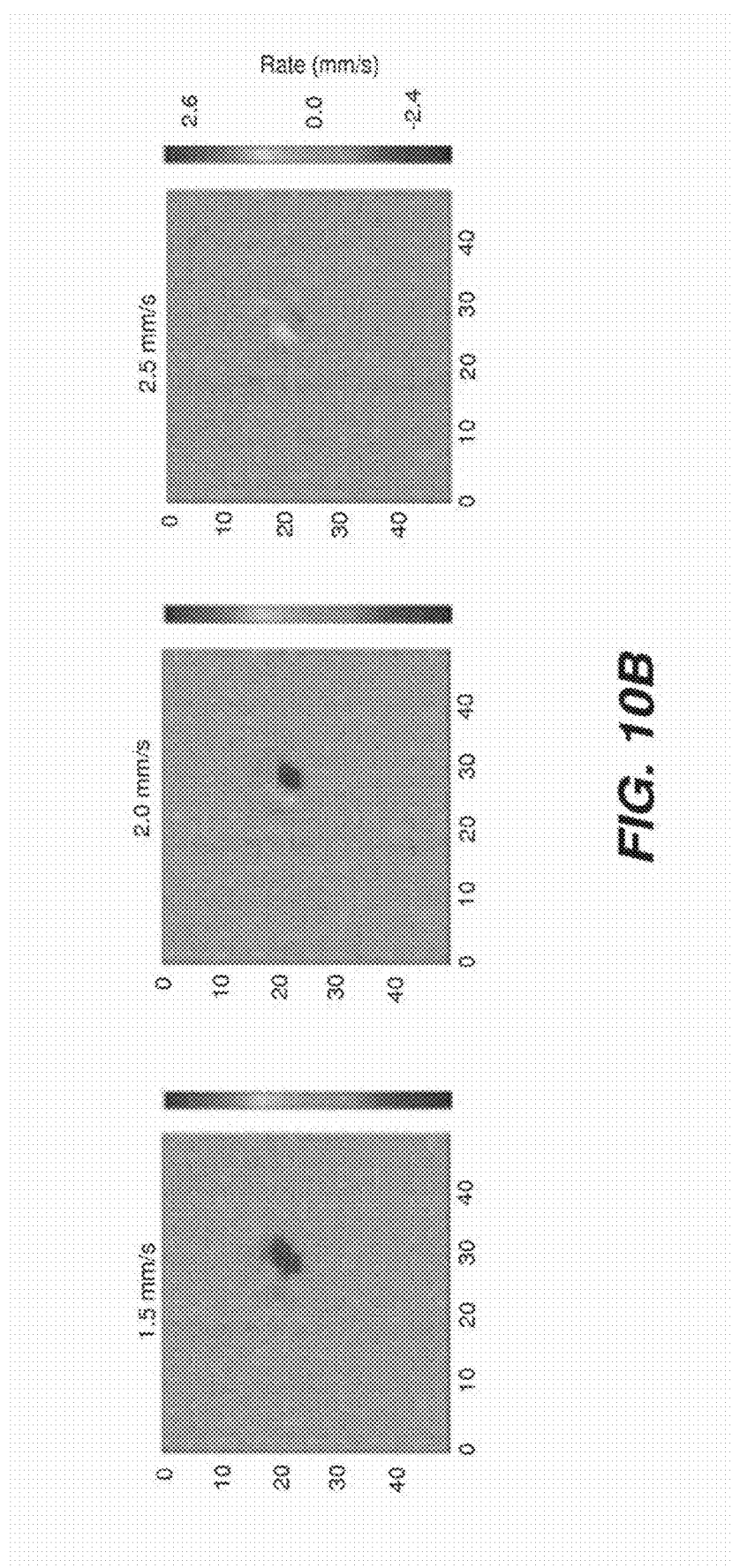
Figure 10C:
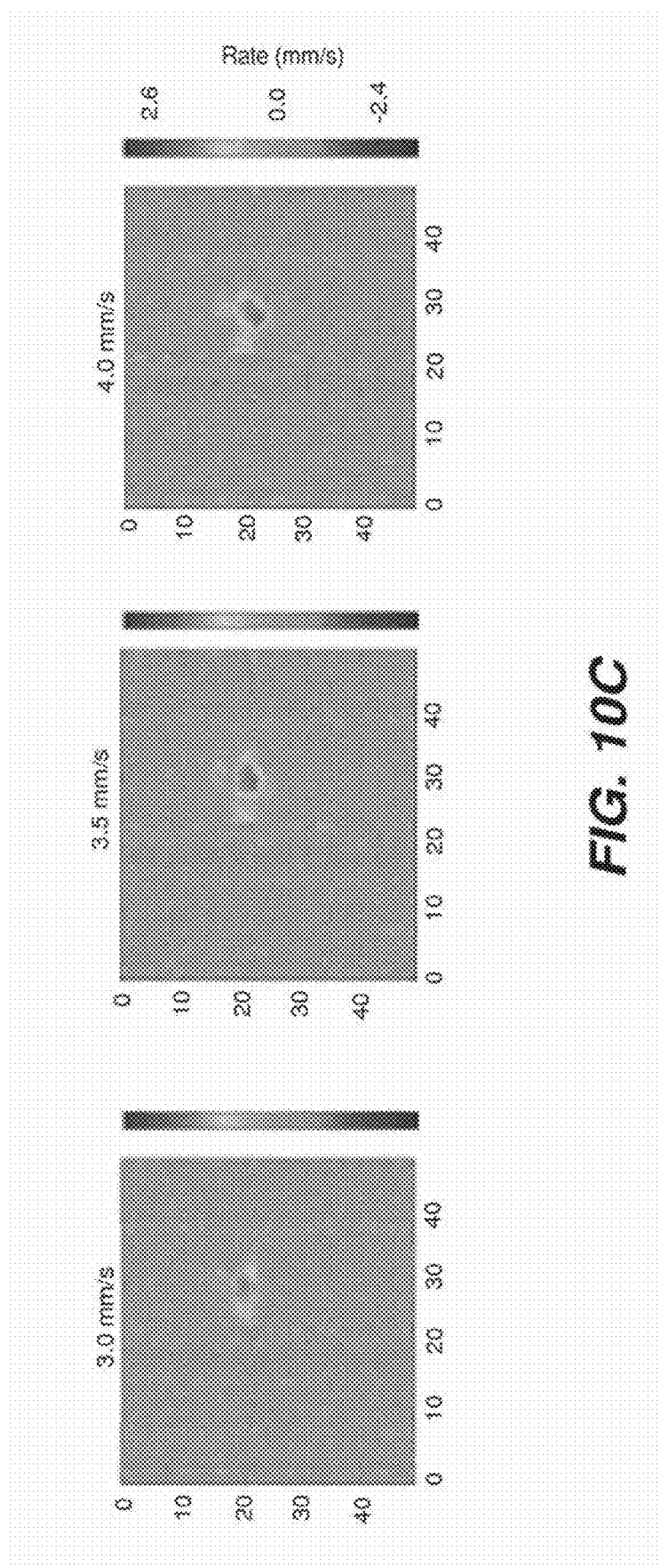

FIG. 10A-10C shows plots of target rate measurements obtained using the system 800 of FIG. 8 and the unit cell 902 of FIG. 9A. Each plot is the average of over 128 pulse-pair rate estimates and "wraps-around" as the rate exceeds 2.6 mm/s. The bars to the right of each plot indicate the velocity scale. The target was a small diffuse plate mounted on a constant-rate translation stage that moved away from the DFPA 80 at various rates. The illuminating waveform included a repetitive sequence of coherent pulse pairs in which the phase difference (as defined, e.g., by ArcTan[Q/I]) between the pulse pair encodes the target rate as follows:

$$R_{Target} = \frac{\Delta \phi_{Pulse-Pair}}{T_{Pulse-Pair}} \frac{\lambda}{4\pi}$$

where $R_{Target}$ equals the target rate in (m/s); $\Delta\phi_{Pulse-Pair}$ is the phase difference between pulses in a given pulse par in (rad); $T_{Pulse-Pair}$ is the separation between pulses in a given pulse pair in (s); and $\lambda$ is the wavelength wavelength of the transmitted beam in (m).

In this experiment, the wavelength was 1550 nm and pulse pair separation was about 150 µs, which resulted in an unambiguous target rate equal to ±2.6 mm/s. The target rates were varied between 0 and 4 mm/s (hence observed "wrap-around" at rates greater than 2.6 mm/s). The target was imaged onto a small number of detectors (unit cells), and the rate estimates were averaged over multiple pulse-pairs to improve the signal-to-noise ratio.

Variable Capacitors for Mitigating Dead Time

Switching a counter between modes of operations (e.g., from count-up mode to count-down mode) may involve preventing the counter 130 from perform operations such as negation. Consider the following example implementation of in-phase and quadrature components in two register banks

|  | In-Phase Counter | Quadrature Counter |
| --- | --- | --- |
| Phase 1 | Count up | Count down |
| Phase 2 | Count up | Count up |
| Phase 3 | Count down | Count up |
| Phase 4 | Count down | Count down |

Note that the transitions between count directions do not occur at the same time for both counters. If, for example, backward counting is implemented using a negate-count-negate method, and if pixel area constraints require the sharing of some of the control signals for both banks, then it may be desirable to stop the counting in the in-phase counter when switching the operating mode of the quadrature counter. This extra transition can induce unwanted dead time and/or noise.

Referring again to FIG. 9A, the unit cell 902 includes a variable capacitor 908 with a high-capacitance mode and a low-capacitance mode in the photocurrent injection path that mitigates unwanted dead time and/or noise. One way to implement this variable capacitor 908 is by using a metal-oxide-semiconductor capacitor, with the depletion state used for low capacitance mode and either the accumulation or inversion region used for high capacitance mode. During normal count operation, the variable capacitor 908 is kept in low capacitance mode. During a mode transition, the variable capacitor 908 is switched to high capacitance mode, and photocurrent is integrated onto the variable capacitor 908 while the mode transition takes place. Then, once back in count mode, the variable capacitor 908 returns to low capacitance mode and discharges any integrated photocurrent collected during the mode transition into the current-to-frequency converter 918.

Spatial Filtering with Multiple Independently Controllable Counters Per Unit Cell In addition to the temporal kernels described above, DPFAs with multiple independently controllable counters per unit call can also implement spatial kernels using a combination of orthogonal shifting and bidirectional counting. A Roberts' Cross filter, as used, e.g., for edge detection, may be implemented by applying the kernels shown in the insets of FIGS. 11A and 11B to two different counters in a single unit cell. These kernels may be implemented on the readout using the sequence of operations described below. Then the resulting digital values in each register may be used to compute, edge angles and edge gradients in the scene.

Implementing a Roberts' Cross filter involves a one-time setup followed by a series of execution steps repeated once per frame. Setup includes setting the size of the least significant bit in an N-bit segmented counter structure, then partitioning the counter structure into the a pair of N/2-bit counter segments (referred to herein as Registers A and B). The Roberts' Cross filter is executed every frame by zeroing the counter segments, then integrating pulses in each counter segment for half the integration period ($T_{int}/2$) to give a count in Register A of $(T_{int}/2)(I_{flux[x0,y0]}/LSB)$ and a count in Register B of $(T_{int}/2)(I_{flux[x0,y0]}/LSB)$. Next, the count in Register A is shifted up by one unit cell and left one by unit cell, and the count in Register B is shifted up one by unit cell and right by one unit cell. (Data is also shifted into Registers A and B from adjacent unit cells.) The counts in both registers are negated, i.e., switched in sign, before Registers A and B integrate for the second half of the integration period ($T_{int}/2$) to give a count in Register A of $(T_{int}/2)(I_{flux[x0-1,y0+1]}-I_{flux[x0,y0]})/LSB$ and a count in Register B of $T_{int}(I_{flux[x0+1,y0+1]}-I_{flux[x0,y0]})/LSB$. The resulting N-bit image is read out for evaluation and, if desired, further processing.

Figure 11A:
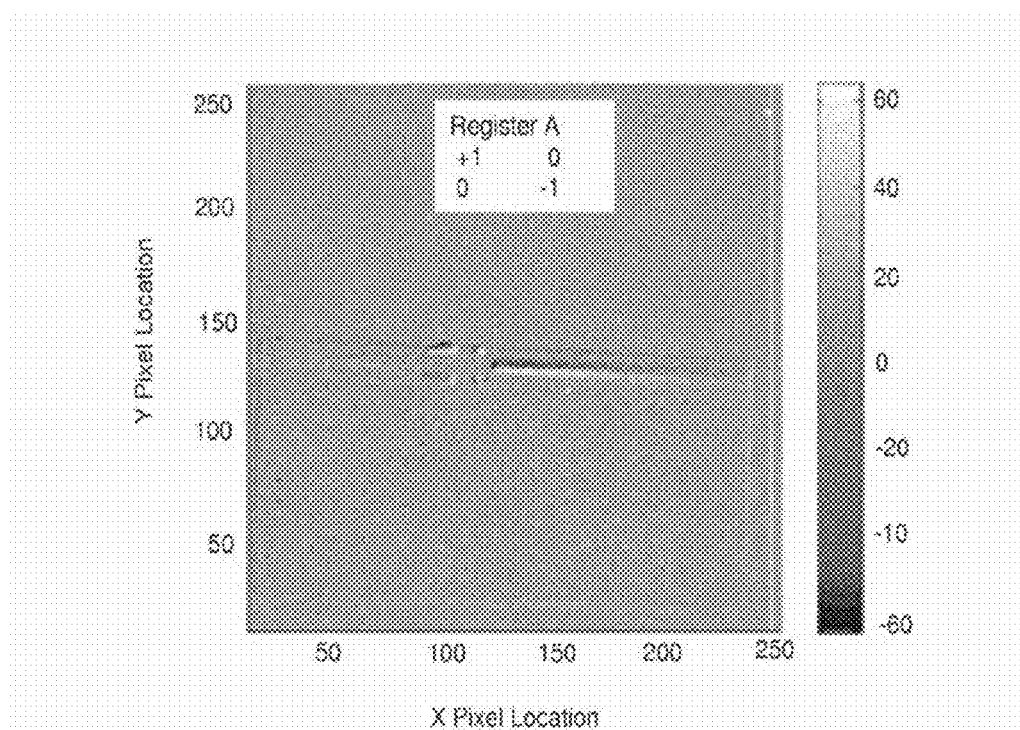
FIGS. 11A-11D include plots of spatially filtered digital data processed by a read-out integrated circuit with two independently controllable counters per unit cell, according to one embodiment of the present invention.
Figure 11B:
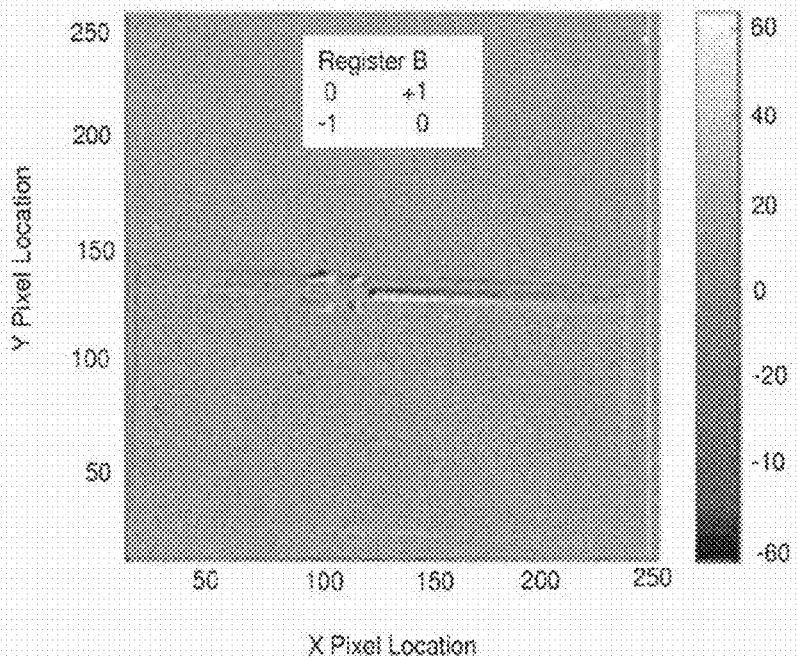
Figure 11C:
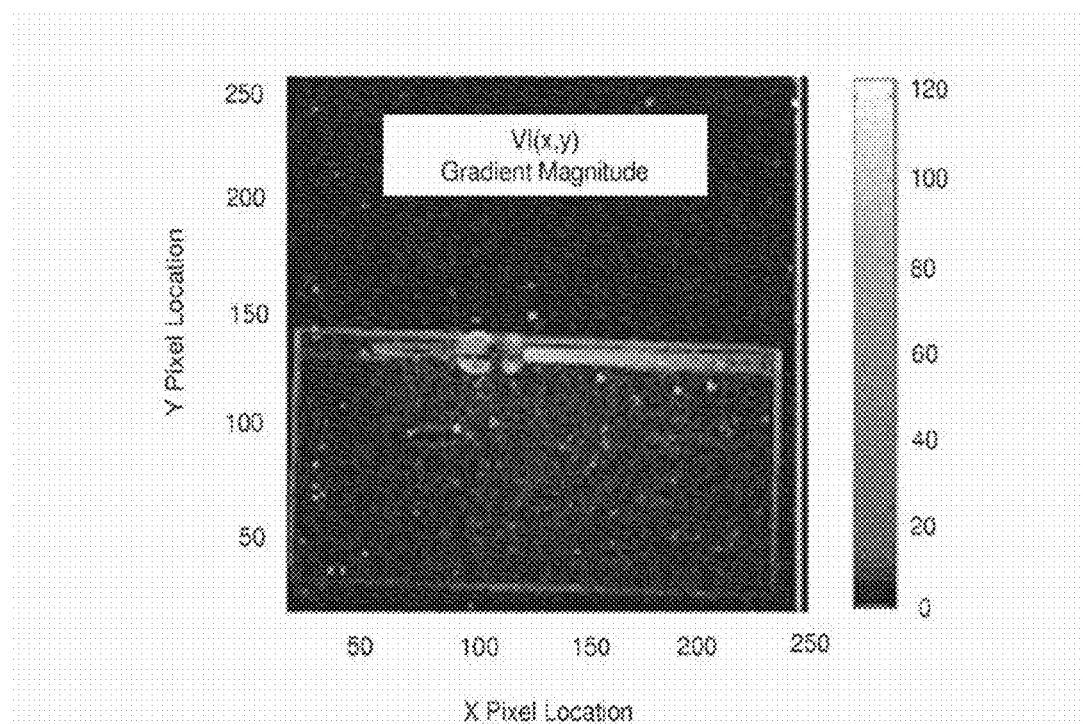
Figure 11D:
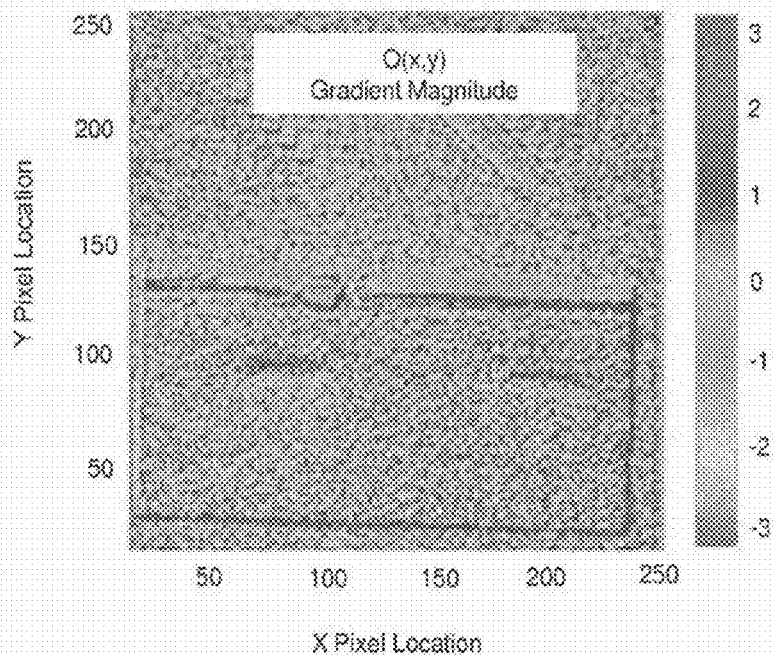

FIGS. 11A-11D are plots that illustrate measurements made by applying two independent 2×2 Roberts' Cross convolution kernels on chip to acquired image data prior to image readout. FIGS. 11A and 11B show plots of data collected by the first and second counters, respectively, in each unit cell and the Roberts' Cross filter kernels used to control the counters. FIG. 11C is a plot of the gradient of the magnitude of the digital data, and FIG. 11D is a plot of the direction of the gradient. The image data were acquired unit cells that each included a sixteen-bit counter structure divided into a pair eight-bit counter segments. Specifically, the on-chip filtered images shown in FIGS. 11A and 11B correspond to the convolution of the observed image with the Roberts' Cross kernels shown in the insets of FIGS. 11A and 11B, respectively. The size of the convolution kernel that can be applied is only limited by the size and format of the DFPA. The filtered images are read-out directly from the DFPA and processed off-chip (i.e., using one or more external processors) to obtain the image spatial gradient ($Sqrt[A^2+B^2]$) shown in FIG. 11C and the spatial gradient phase (ArcTangent[B/A]) shown in FIG. 11D.

Advanced Mathematical Features

The design elements described above may be used in conjunction with additional logic to allow for the implementation of a wide variety of mathematical and signal processing features.

Absolute Value

DFPA has the ability to take the absolute value of the counter register contents and perform left and right shifts using a barrel shifter. These functions are implemented at the pixel level and can be performed on the digitized imager data in real time.

Figure 12:
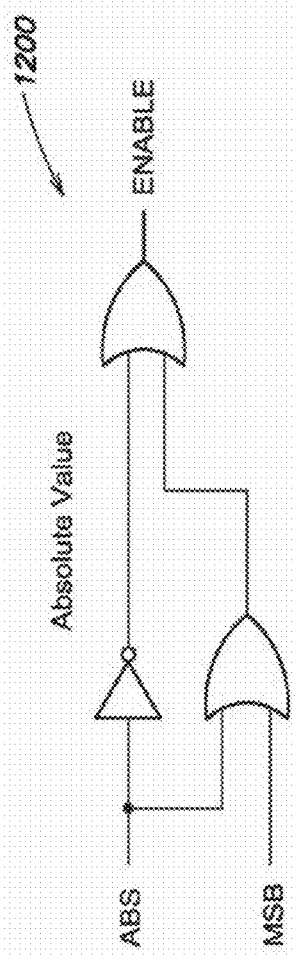
FIG. 12 is a block diagram of logic gates configured to drive a counter in an absolute value of an input bit, according to one embodiment of the present invention.

FIG. 12 is a diagram of an absolute value circuit 1200 configured to implement an absolute value function that can be used in conjunction with the counter's up/down counting capability to detect small changes in an otherwise static scene. Such changes can be periodic. This operation can be built on the synchronous one's complement negation. To take the absolute value of a one's complement negative number, all bits of the number are flipped. Thus, the counter input mode SQBAR is used to flip the counter bits on a falling edge of ROCLK. Referring to FIG. 12, the ROCLK is enabled or disabled via the internal CLOCK_EN signal.

Referring to FIG. 12, a control signal "ABS" is defined to allow selection of the absolute value function. A logic function such as the following can then be used to selectively complement pixels or register segments with negative data: ENABLE=NOT(ABS) OR (ABS AND MSB). Here ENABLE is intended to be used to gate the synchronous clock. In this case, if ABS is asserted, the clock will only be seen by the register logic if the MSB of the register (i.e., the sign bit) is high.

Conditional Operations and In-Pixel Thresholding

The absolute value operation described above may be considered to be a conditional clock gating applied to the case of a negation operation. This may be used more generally. For example, consider a unit cell with a six-bit counter and a twelve-bit counter. The conditional clock gating approach applied in the absolute value operation can be used to multiply or divide the value in the twelve-bit register by a power of two based on the MSB in the six-bit register.

We can also perform a thresholding operation. Consider the case in which we have a single N-bit counter. We first initialize the counter to a negative value (the complement of the threshold). We then perform our integration step, counting up proportionate to photocurrent. Finally, we use the MSB to gate a synchronous clock-in-zero operation. Any counter that has not crossed the zero point (and thus still contains a negative value) will be reset to zero.

Local Clock Enable

Figure 13:
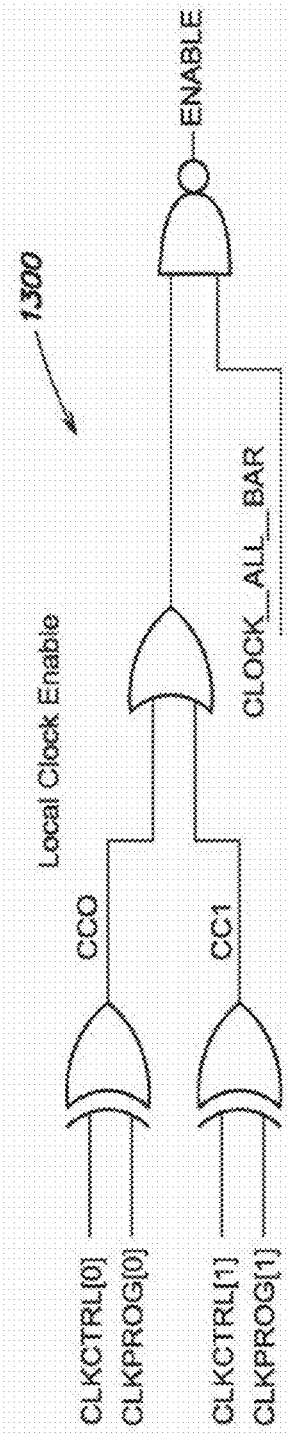
FIG. 13 is a block diagram of a local clock enable circuit, according to one embodiment of the present invention.

FIG. 13 is a diagram of a local clock enable circuit 1300 that be used to synchronously localize synchronous and/or asynchronous operations based on a setting in in-pixel memory 160. For example, consider the case in which two SRAM bits are instantiated within each pixel, containing the configuration setting CLKPROG[1:0]. Referring to FIG. 13, if a global two-bit input CLKCTRL[1:0] is provided, the XOR-based circuit can be used to selectively gate the clocks within an arbitrary spatially localized area. The bit depth of CLKPROG and CLKCTRL determine the number of independently gated spatial regions, and the override signal CLK_ALL_BAR shown allows the regional gating to be overridden in cases where an instruction is intended for the entire array.

Command and Control System

Figure 14:
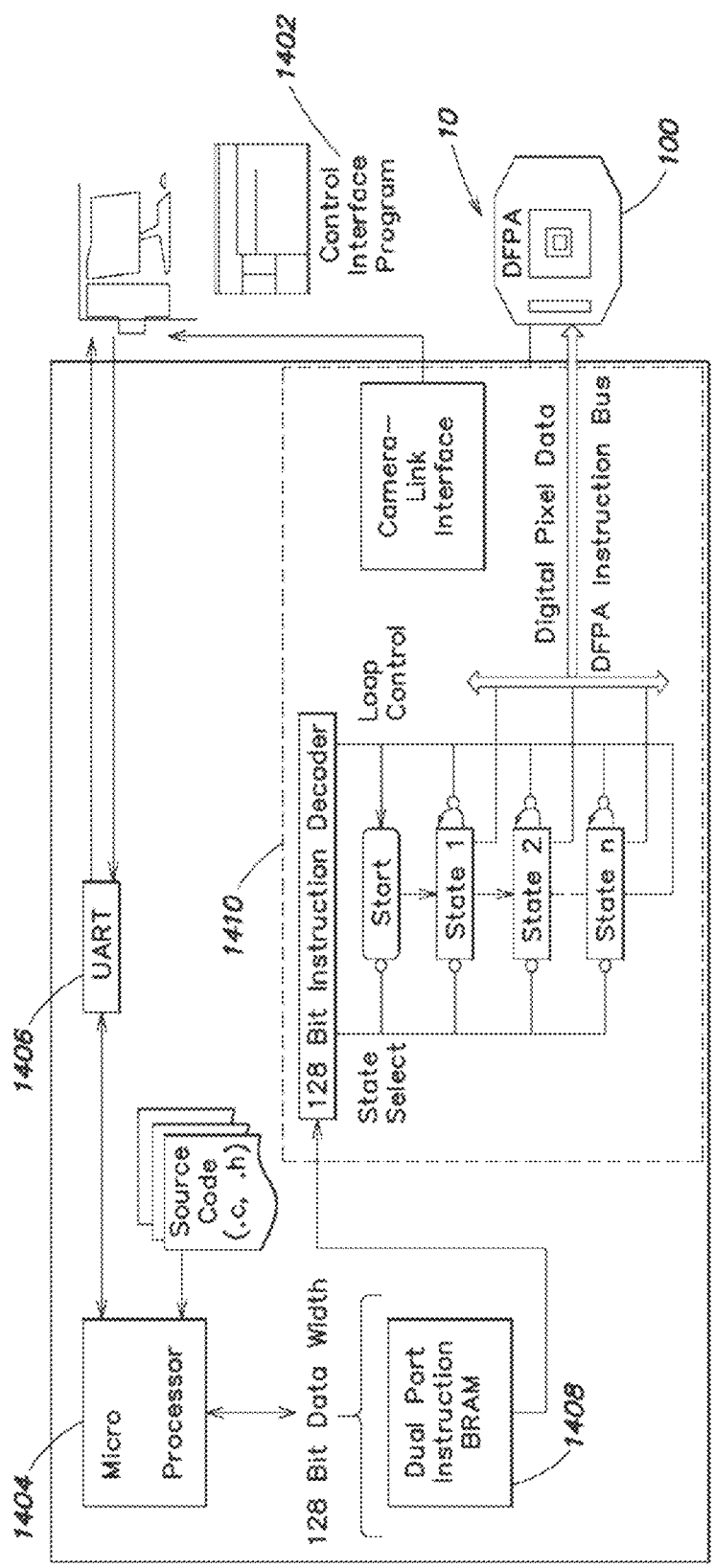
FIG. 14 is a diagram of a control system/firm interface configured to control a DFPA, with multiple independently controllable counters per unit cell, according to one embodiment of the present invention.

FIG. 14 is a block diagram of a flexible command and control system 1400 that supports effective and customizable use of the signal processing features of the DFPA 100. In exemplary embodiments, the command and control system 1400 generates and issues the control signals used to control at least one (and in some cases, all) of the independently controllable counters 130 in one or more unit cells 102 in the DFPA 10. The structure of a command and control system 1400 is based on a very long word instruction set architecture. The system 1400 includes user interface 1402 implemented via either a terminal prompt, a Matlab-based control interface, or another suitable interface program that communicates with a soft-core processor 1404 on a field-programmable gate array (FPGA) control board via a serial data link 1406 (e.g., a universal asynchronous receiver/transmitter (UART) link). The primary function of the processor is to manage the user access to a random access memory (RAM) 1408 (e.g., a dual-port instruction block RAM), which in one implementation may be 128 bits wide.

A control state machine 1410 decodes and executes the instructions in the RAM 1408 to generate the low-level control signals. The control state machine 1410 is a system that includes a finite number of states and transitions between states. A transition is a set of actions that begins in one state and ends in another state or the same state. A transition is triggered by an event or a condition. An implementation of a state machine is in a digital circuit. For example, a state machine can be built using an integrated circuit, programmable logic device, a programmable logic controller, logic gates and flip flops or relays. An example of a hardware implementation of a state machine can include a register that stores state variables, combinational logic that determines state transitions, and combinational logic that determines the output of the state machine.

The command and control system 1400 provides a command and control interface (CCI) is that of a very long word instruction set architecture (VLWISA) in which the read-out integrated circuit 100 in the DFPA 10 is treated as a single-instruction, multiple-data (SIMD) processor. TABLE 3 lists an example instruction set used by the CCI to communicate with the read-out integrated circuit 100.

TABLE 3

Example Instruction Set

| Instruction | Arguments | Description |
| --- | --- | --- |
| BCFG1 | repeat_factor, bit_list, mask_list | Set ROIC input pins (set 1) |
| BCFG2 | repeat_factor, bit_list, mask_list | Set ROIC input pins (set 2) |
| IOCFG | repeat_factor, io_side bit_list, mask_list | Set ROIC data input pins |
| PAUSEPRGM | None | Pause program counter and wait for resume signal to be asserted |
| LOOP | n_iterations | Begin finite loop block |
| ENDLOOP | None | End loop block |
| LOOPINF | None | Begin infinite loop block |
| ENDLOOPINF | None | End infinite loop block |
| DELAY | n_iterations | No-op loop |
| RDLNO | dir_bit_list, dir_mask_list | Read out one line of data |
| RESTART | None | Reset program counter to zero |
| NOOP | None | No-op |
| SUBROUTINE | pointer_name | Begin subroutine block |
| ENDSUBROUTINE | None | End of subroutine block |
| JUMP | pointer_name | Jump to subroutine |
| RETURN | | Return from subroutine |
| LOOPVAR | Pointer | Begin finite loop with iterations set in variable memory |
| VARIABLE | pointer, value | Set value in variable memory |
| IFEQ0 | Pointer | Begin block that executes if pointer points to location with value 0 |
| ENDIFEQ0 | None | End of IFEQ0 block |

The instructions in TABLE 3 may be used to perform signal processing. For example, the instructions can be used to implement shift, photocurrent integration, and/or data negation as described below. To shift data from north to south by one unit when the clock gating signal is asserted for the applicable counters 130, the command and control system 1400 may transmit the following instructions to the integrated circuit 100:

```
SUBROUTINE SHIFT_DATA_N_TO_S
    # Counter/registers will shift in from the north
    BCFG1 MODE=SN
    # Shift occurs on falling edge
    BCFG1 ROCLK_ARRAY=0
    BCFG1 ROCLK_ARRAY=1
ENDSUBROUTINE
```

Similar instructions may be implemented to shift data in other directions (e.g., east-west), or the ISA may be extended to allow for MODE to be set to a value resident in variable memory. To integrate photocurrent, the command and control system 1400 may transmit the following instructions to the integrated circuit 100:

```
SUBROUTINE INTEGRATE_PHOTOCURRENT
    # The three steps to transition to count mode are
    # designed to prevent data corruption due to
    # unwanted clock edges
    BCFG1 MODE=SQ
    BCFG1 MODE=CQ
    BCFG1 MODE=CQBAR
    # Connect oscillator to counter
```

```
BCFG1 PG0=1 PG8=1
# This loop sets the integration time
LOOPVAR INT_TIME
    DELAY 0x400
ENDLOOP
# Disconnect oscillator from counter
BCFG1 PG0=0 PG8=0
ENDSUBROUTINE
```

Varying the time that the counter 130 is connected to the oscillator (clock) changes the counter's integration period. To negate data stored in a counter 130, the command and control system 1400 may transmit the following instructions to the integrated circuit 100:

```
SUBROUTINE NEGATE_DATA
    # Transition to negate mode
    BCFG1 MODE=SQ
    BCFG1 MODE=SQBAR
    # Pixels negated on    falling edge
    BCFG1 ROCLK_ARRAY=0
    BCFG1 ROCLK_ARRAY=1
    BCFG1 MODE=SQ
ENDSUBROUTINE
```

It is possible to implement a wide range of linear static kernel filters by combining the orthogonal data transfer capability, bidirectional integration/ones complement negation, variable integration times, and barrel shift functions of the integrated circuit 100. One simple example that leverages register segmentation capability is a Roberts' Cross computation as described above with respect to FIGS. 11A-11D.

To compute a Roberts Cross, two kernels are convolved with the input image. This operation can be implemented using the following operations, expressed in terms of the instruction set and subroutines described previously. Some initialization steps are not shows, including partitioning of the 16-bit pixel register into two 8-bit registers and preloading the array shift-in registers with all zeros so that all pixels are loaded with zeros as data is shifted out.

First, perform integration for half the integration period $T_{int}/2$:
JUMP INTEGRATE_PHOTOCURRENT After integration for half the integration period, the counters contain the following values:

$N_{countsA}=T_{int}*I_{flux(x0,y0)}/2LSB$    Register A:

$N_{countsB}=T_{int}*I_{flux(x0,y0)}/2LSB$    Register B:

Next, the integrated circuit 100 performs shift operations on the upper and lower segments of the counter. Register A (bits 0-7) data shift up and left by one pixel. Register B (bits 8-15) data shift up and right by one pixel:

```
JUMP SHIFT_DATA_S_TO_N
BCFG PG0=0 PG8=1    # Next op. only for bits 8-15
JUMP SHIFT_DATA_W_TO_E
BCFG PG0=1 PG8=0    # Next op. only for bits 0-7
JUMP SHIFT_DATA_E_TO_W
```

The data collected in the previous integration cycle correspond to the negative component of the kernel. Hence, the integrated circuit 100 negates the data globally, then integrates to collect data corresponding to the positive component of the kernel.

JUMP NEGATE_DATA
JUMP INTEGRATE_PHOTOCURRENT

After this, the counters contain the following values:

$N_{countsA}=T_{int}*(I_{flux(x0-1,y0+1)}-I_{flux(x0,y0)})/2LSB$    Register A:

$N_{countsB}=T_{int}*(I_{flux(x0+1,y0-1)}-I_{flux(x0,y0)})/2LSB$    Register B:

A full frame can be readout or a local query can be performed for a region of interest and a decision can be made based on the reduced information set contained therein. During the readout process, the edge gradient and edge angle can be computed in the readout path on the FPGA board using the following equations:

Edge gradient=$(N_{countsA}^2+N_{countsB}^2)^{1/2}$

Edge angle=$\tan^{-1}(N_{countsB}/N_{countsA})$

FIGS. 11A-11D show results for a Robert's Cross kernel filter on a simulated image.

The command and control system 1400 may also instruct the integrated circuit 100 to perform an I/Q detection operation with the parameters $T_{IF}$=intermediate frequency period, $N_{cycles}$=number of IF periods to be collected per frame, and PGi=PULSEGATE signal for bit I (e.g., PG0 is the PULSEGATE signal for the lower bits (0-7) and PG8 is the PULSEGATE signal for the upper bits (8-15)). At time zero, the array is configured to a predetermined state (e.g., a segmented configuration initialized to a zero value). Some initialization steps are not shown or explicitly stated below, including configuring the sixteen-bit counter structure into two eight-bit registers and preloading the array shift-in registers with all zeros. For the purpose of discussion, the in-phase channel (I channel) and quadrature channel (Q channel) are represented by the lower eight bits and upper eight bits of the sixteen-bit counter structure, respectively. In addition, the subroutine INTEGRATE_PHOTOCURRENT is defined to integrate for $T_{IF}/4$ minus a slight correction time representing the elapsed time associated with operations such as digital negation and register reconfiguration.

First, the integrated circuit 100 begins an outer loop that implements the repetition of the I/Q collect timing for $N_{cycles}$. Each part of the loop begins with a configuration command (BCFG) that sets the values of the control bits. Function calls following the configuration command always execute, but are applied to only the component enabled by the preceding configuration command.
LOOP {$N_{cycles}$}
First, the counters 130 in the integrated circuit 100 integrate for approximately $T_{IF}/4$:

```
BCFG PG0=1 PG8=1    # Configure both I & Q...
                    # ...channels to integrate
# Integrate photocurrent for TIF/4
JUMP INTEGRATE_PHOTOCURRENT
```

The integrated circuit 100 negates the contents of the quadrature register only, and then integrates for another quarter of the integration period TIF/4 (refer to FIG. 1):

```
BCFG PG0=0 PG8=1    # Configure Q channel...
JUMP NEGATE_DATA    # ...to negate data
BCFG PG0=1 PG8=1    # Configure I and Q...
                    # ...channels to integrate
                    # Integrate photocurrent for TIF/4
JUMP INTEGRATE_PHOTOCURRENT
```

The integrated circuit 100 negates the contents of the in-phase register only, and then integrates for another $T_{IF}/4$:

```
BCFG PG0=1 PG8=0     # Configure I channel...
JUMP NEGATE_DATA     # ...to negate data
BCFG PG0=1 PG8=1     # Configure both I & Q...
                     # ...channels to integrate
JUMP INTEGRATE_PHOTOCURRENT
```

Next, the integrated circuit 100 negates the contents of the quadrature register only, and then integrates for another $T_{IF}/4$:

```
BCFG PG0=0 PG8=1     # Configure Q channel...
JUMP NEGATE_DATA     # ...to negate data
BCFG PG0=1 PG8=1     # Configure both I & Q channels...
                     # ...to integrate
JUMP INTEGRATE_PHOTOCURRENT
```

The integrated circuit 100 negates the contents of the in-phase register only to complete the loop block.

```
BCFG PG0=1 PG8=0     # Negate only the I channel
JUMP NEGATE_DATA
ENDLOOP
```

After the integrated circuit 100 completes the loop, data can be read out.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, the embodiments may be implemented using hardware, software or a combination thereof. When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. An apparatus for counting pulses representing an analog signal, the apparatus comprising:
an integrated circuit operably coupled to a photodetector array, the integrated circuit comprising a plurality of unit cells, wherein at least one unit cell in the plurality of unit cells comprises:
(i) a converter to convert a photocurrent from at least one photodetector in the photodetector array to a series of pulses;
(ii) a first counter, operably coupled to the converter, to count first pulses in the series of pulses in response to a first clock selection signal and according to a first operating mode; and
(iii) a second counter, operably coupled to the converter, to count second pulses in the series of pulses in response to a second clock selection signal and according to a second operating mode,
wherein the first operating mode and the second operating mode are independently controllable by a first control signal and a second control signal, respectively.

2. The apparatus of claim 1, wherein the at least one unit cell further comprises a switch, wherein the converter is electrically coupled to the first counter and the second counter via the switch.

3. The apparatus of claim 1, wherein the at least one unit cell further comprises a multiplexer, wherein the converter is electrically coupled to the first counter and the second counter via the multiplexer.

4. The apparatus of claim 1, wherein an integration time of the first counter differs from an integration time of the second counter.

5. The apparatus of claim 1, wherein the integrated circuit further comprises intra-cell transfer circuitry to shift data between the first counter and the second counter.

6. The apparatus of claim 5, wherein the first counter is configured to shift data to the second counter in response to a shift signal.

7. The apparatus of claim 1, wherein the first counter and/or the second counter is/are a partitioned segment of a segmented counter.

8. The apparatus of claim 1, wherein:
the first operating mode is switchable, by the first control signal, to at least one of: a barrel shift mode, a right shift mode, a left shift mode, a ripple count mode, a ones complement mode, a count-up mode, a count-down mode, a data shift mode, or a read-out mode; and
the second operating mode is switchable, by the second control signal, to at least one of: a barrel shift mode, a right shift mode, a left shift mode, a ripple count mode, a ones complement mode, a count-up mode, a count-down mode, a data shift mode, or a read-out mode.

9. The apparatus of claim 1, wherein the at least one unit cell further comprises logic circuitry, operably coupled to at least one of the first counter and the second counter, to convert a count stored in the first counter into an absolute value of the count.

10. The apparatus of claim 1, wherein the first counter is configured to perform a multiply-by-two operation.

11. The apparatus of claim 1, wherein the first counter is configured to perform a divide-by-two operation.

12. A method of counting pulses representing an analog signal in at least one unit cell in a plurality of unit cells, the at least one unit cell comprising a first counter, a second counter, and a converter operably coupled to the first counter, the second counter, and a photodetector array, the method comprising:
producing a photocurrent, with at least one photodetector in the photodetector array, in response to detection of light;
converting the photocurrent, with the converter, into a series of pulses;
counting, with the first counter, first pulses in the series of pulses according to a first operating mode set by a first control signal; and
counting, with the second counter, second pulses in the series of pulses according to a second operating mode set by a second control signal that is different from the first control signal.

13. The method of claim 12, further comprising:
shifting at least a portion of a count of the first counter and at least a portion of a count of the second counter to different respective unit cells in the plurality of unit cells;
receiving shifted counts in each of the first counter and the second counter from further different respective unit cells in the plurality of unit cells; and
counting: (1) third pulses in the series of pulses with the first counter and (2) fourth pulses in the series of pulses with the second counter, to obtain further respective counts.

14. The method of claim 12, wherein the first counter and the second counter are independently controllable by the first control signal and the second control signal, respectively.

15. The method of claim 12, further comprising:
shifting data from the first counter to the second counter and/or shifting data from the second counter to the first counter in response to a shift signal.

16. The method of claim 12, wherein:
the first operating mode is one of: a barrel shift mode, a right shift mode, a left shift mode, a ripple count mode, a ones complement mode, a count-up mode, a count-down mode, a data shift mode, or a read-out mode; and/or
the second operating mode is one of: a barrel shift mode, a right shift mode, a left shift mode, a ripple count mode, a ones complement mode, a count-up mode, a count-down mode, a data shift mode, or a read-out mode.

17. The method of claim 12, further comprising:
switching the first operating mode, by the first control signal, to one of: a barrel shift mode, a right shift mode, a left shift mode, a ripple count mode, a ones complement mode, a count-up mode, a count-down mode, a data shift mode, or a read-out mode; and/or
switching the second operating mode, by the second control signal, to one of: a barrel shift mode, a right shift mode, a left shift mode, a ripple count mode, a ones complement mode, a count-up mode, a count-down mode, a data shift mode, or a read-out mode.

18. The method of claim 12, further comprising:
converting a count stored in the first counter into an absolute value of the count.

19. The method of claim 12, further comprising:
performing a multiply-by-two operation in at least one of the first counter and the second counter.

20. The method of claim 12, further comprising:
performing a divide-by-two operation in at least one of the first counter and the second counter.

* * * * *